US011744063B2

(12) United States Patent
Kim et al.

(10) Patent No.: US 11,744,063 B2
(45) Date of Patent: Aug. 29, 2023

(54) SEMICONDUCTOR MEMORY DEVICES INCLUDING SEPARATE UPPER AND LOWER BIT LINE SPACERS AND METHODS OF FORMING THE SAME

(71) Applicant: SAMSUNG ELECTRONICS CO., LTD., Suwon-si (KR)

(72) Inventors: Daeik Kim, Hwaseong-si (KR); Semyeong Jang, Gunpo-si (KR); Jemin Park, Suwon-si (KR); Yoosang Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 21 days.

(21) Appl. No.: 17/374,624

(22) Filed: Jul. 13, 2021

(65) Prior Publication Data

US 2021/0343724 A1 Nov. 4, 2021

Related U.S. Application Data

(63) Continuation of application No. 16/509,820, filed on Jul. 12, 2019, now Pat. No. 11,088,148, which is a
(Continued)

(30) Foreign Application Priority Data

Apr. 3, 2017 (KR) ........................ 10-2017-0043124

(51) Int. Cl.
*H01L 21/71* (2006.01)
*H01L 21/28* (2006.01)
(Continued)

(52) U.S. Cl.
CPC ........... *H10B 12/482* (2023.02); *H01L 21/71* (2013.01); *H01L 29/40114* (2019.08);
(Continued)

(58) Field of Classification Search
CPC .............. H01L 27/10885; H01L 21/71; H01L 27/10808; H01L 27/10814;
(Continued)

(56) References Cited

U.S. PATENT DOCUMENTS 8,962,472 B2 2/2015 Rho et al.
9,184,091 B2 11/2015 Song et al.
(Continued)

FOREIGN PATENT DOCUMENTS

| KR | 1020130123687 A | 11/2013 |
| KR | 1020140086648 A | 7/2014 |
| KR | 1020160147483 A | 12/2016 |

OTHER PUBLICATIONS

Notice of Allowance issued in parent U.S. Appl. No. 15/845,141 dated Mar. 20, 2019.
(Continued)

*Primary Examiner* — Benjamin Tzu-Hung Liu
(74) *Attorney, Agent, or Firm* — Sughrue Mion, PLLC

(57) ABSTRACT

A volatile memory device can include a bit line structure having a vertical side wall. A lower spacer can be on a lower portion of the vertical side wall, where the lower spacer can be defined by a first thickness from the vertical side wall to an outer side wall of the lower spacer. An upper spacer can be on an upper portion of the vertical side wall above the lower portion, where the upper spacer can be defined by a second thickness that is less than the first thickness, the upper spacer exposing an uppermost portion of the outer side wall of the lower spacer.

22 Claims, 33 Drawing Sheets

Related U.S. Application Data continuation of application No. 15/845,141, filed on Dec. 18, 2017, now Pat. No. 10,373,960.

(51) Int. Cl.
  *H01L 29/792* (2006.01)
  *H01L 21/8234* (2006.01)
  *H10B 12/00* (2023.01)

(52) U.S. Cl.
  CPC ....... *H01L 29/7926* (2013.01); *H10B 12/053* (2023.02); *H10B 12/31* (2023.02); *H10B 12/315* (2023.02); *H10B 12/34* (2023.02); *H10B 12/48* (2023.02); *H01L 21/823475* (2013.01)

(58) Field of Classification Search
  CPC ......... H01L 27/10823; H01L 27/10876; H01L 27/10882; H01L 29/40114; H01L 29/7926; H01L 21/823475; H10B 12/482; H10B 12/053; H10B 12/31; H10B 12/315; H10B 12/34; H10B 12/48
  See application file for complete search history.

(56) References Cited

U.S. PATENT DOCUMENTS

| | | |
|---|---|---|
| 9,257,437 B2 | 2/2016 | Park et al. |
| 9,318,382 B2 | 4/2016 | Kim |
| 9,337,203 B2 | 5/2016 | Hwang et al. |
| 9,349,633 B2 | 5/2016 | Kim et al. |
| 9,520,348 B2 | 12/2016 | Choi et al. |
| 9,543,202 B2 | 1/2017 | Koo et al. |
| 2007/0224758 A1 | 9/2007 | Park |
| 2007/0241378 A1 | 10/2007 | Aritome |
| 2011/0260238 A1 | 10/2011 | Kim |
| 2013/0292847 A1* | 11/2013 | Choi ................. H01L 21/76816 257/774 |
| 2014/0291804 A1 | 10/2014 | Kim |
| 2015/0255466 A1 | 9/2015 | Hwang |
| 2015/0333069 A1 | 11/2015 | Kim et al. |
| 2016/0267949 A1 | 9/2016 | Han et al. |
| 2016/0276349 A1 | 9/2016 | Kwon |

OTHER PUBLICATIONS

Final Office Action issued in parent U.S. Appl. No. 15/845,141 dated Jan. 25, 2019.

Office Action issued in parent U.S. Appl. No. 15/845,141 dated Jun. 28, 2018.

Notice of Allowance issued in parent U.S. Appl. No. 16/509,820 dated Apr. 14, 2021.

Office Action issued in parent U.S. Appl. No. 16/509,820 dated Jun. 25, 2020.

* cited by examiner

SEMICONDUCTOR MEMORY DEVICES INCLUDING SEPARATE UPPER AND LOWER BIT LINE SPACERS AND METHODS OF FORMING THE SAME

CROSS-REFERENCE TO RELATED APPLICATIONS

This is a continuation of U.S. application Ser. No. 16/509,820, filed on Jul. 12, 2019, which is a continuation of U.S. application Ser. No. 15/845,141, filed on Dec. 18, 2017, now U.S. Pat. No. 10,373,960 issued Aug. 6, 2019, which claims priority under 35 U.S.C. § 119 of Korean Patent Application No. 10-2017-0043124 filed on Apr. 3, 2017, the entire contents of the above are hereby incorporated by reference.

BACKGROUND

The present inventive concept relates to a semiconductor memory device.

Line widths of patterns of the semiconductor device can be reduced to increase integration of the semiconductor device. However, it may be difficult to increase the integration of such semiconductor devices given the exposure techniques needed for such line widths. Thus, various researches have recently been conducted for new integration techniques.

SUMMARY

Embodiments of the present inventive concept can provide semiconductor memory devices including separate upper and lower bit line spacers and methods of forming the same.

In some embodiments, a volatile memory device can include a bit line structure having a vertical side wall. A lower spacer can be on a lower portion of the vertical side wall, where the lower spacer can be defined by a first thickness from the vertical side wall to an outer side wall of the lower spacer. An upper spacer can be on an upper portion of the vertical side wall above the lower portion, where the upper spacer can be defined by a second thickness that is less than the first thickness, the upper spacer exposing an uppermost portion of the outer side wall of the lower spacer.

In some embodiments, a volatile memory device can include a bit line structure including a bit line contact plug, a bit line metal-containing pattern, and a bit line capping pattern stacked on one another. A storage node contact plug can be in a storage node contact hole adjacent to the bit line structure and a lower spacer can include a first sub-spacer and a second sub-spacer on the first sub-spacer, where the first sub-spacer and the second sub-spacer can have a combined thickness, the lower spacer on a vertical side wall of the bit line structure to provide a side wall of the storage node contact hole, the lower spacer having an uppermost surface including respective portions of the first and second sub-spacers. An upper spacer can have an upper thickness that is less than the combined thickness, where the upper spacer has a lowest surface that terminates at the uppermost surface to cover a portion of the uppermost surface and to expose a remaining portion of the uppermost surface.

In some embodiments, a volatile memory device can include a bit line structure that includes a bit line contact plug, a bit line metal-containing pattern, and a bit line capping pattern stacked on one another. A storage node contact plug can be in a storage node contact hole adjacent to the bit line structure and a lower spacer can including a first sub-spacer and a second sub-spacer on the first sub-spacer, the first sub-spacer and the second sub-spacer having a combined thickness, the lower spacer on a vertical side wall of the bit line structure to provide a vertical side wall of the storage node contact hole, the lower spacer having an uppermost surface including respective portions of the first and second sub-spacers. An upper spacer can have an upper thickness that is less than the combined thickness, the upper spacer terminating at the uppermost surface to completely cover the respective portions of the first and second sub-spacers.

In some embodiments, a volatile memory device can include a bit line structure including a bit line contact plug, a bit line metal-containing pattern, and a bit line capping pattern stacked on one another. A storage node contact plug can be in a storage node contact hole adjacent to the bit line structure and a lower spacer can include a first sub-spacer and second sub-spacer on the first sub-spacer, the lower spacer having a combined thickness on a vertical side wall of the bit line structure to provide a vertical side wall of the storage node contact hole, the first sub-spacer having a recessed surface relative to the second sub-spacer to provide a gap in the first sub-spacer. An upper spacer can have a second thickness that is less than the combined thickness, the upper spacer extending on the bit line capping pattern to the recessed surface to fill the gap.

In some embodiments, a volatile memory device include a bit line structure having a vertical side wall and a storage node contact plug adjacent to the bit line structure. A landing pad can be adjacent to the bit line structure on the storage node contact plug and a lower spacer can be defined by a first thickness to define a critical dimension for the storage node contact plug, the lower spacer being on a lower portion of the vertical side wall of the bit line structure. An upper spacer can be defined by a second thickness that is less than the first thickness and the upper spacer being a separate spacer from the lower spacer to define a critical dimension for the landing pad, the upper spacer being on an upper portion of the vertical side wall of the bit line structure above the lower portion.

In some embodiments, a volatile memory device can include a bit line structure. A lower spacer can be defined a first thickness, the lower spacer being limited to a lower portion of a vertical side wall of the bit line structure. An upper spacer can be defined a second thickness that is less than the first thickness, the upper spacer being limited to an upper portion of the vertical side wall of the bit line structure above the lower portion.

In some embodiments, a method of forming a volatile memory device can include forming a bit line structure having a vertical side wall protruding from a substrate, forming a lower spacer layer on the vertical side wall to have a first thickness, removing the lower spacer layer from the substrate adjacent to the bit line structure to form a lower spacer having the first thickness from the vertical side wall to an outer side wall of the lower spacer, forming a storage node contact plug on the substrate aligned to the lower spacer to cover the outer side wall of the lower spacer and to expose an upper portion of the lower space, removing the upper portion of the lower spacer using the storage node contact plug as a mask, and forming an upper spacer on the vertical side wall to expose an uppermost portion of the outer side wall of the lower spacer, the upper spacer formed to have a second thickness that is less than the first thickness.

DETAILED DESCRIPTION OF EMBODIMENTS ACCORDING TO THE INVENTIVE CONCEPT

Hereinafter, exemplary embodiments of the present inventive concept will be described in detail in conjunction with the accompanying drawings to aid in more clearly understanding the present inventive concept.

Figure 1A:
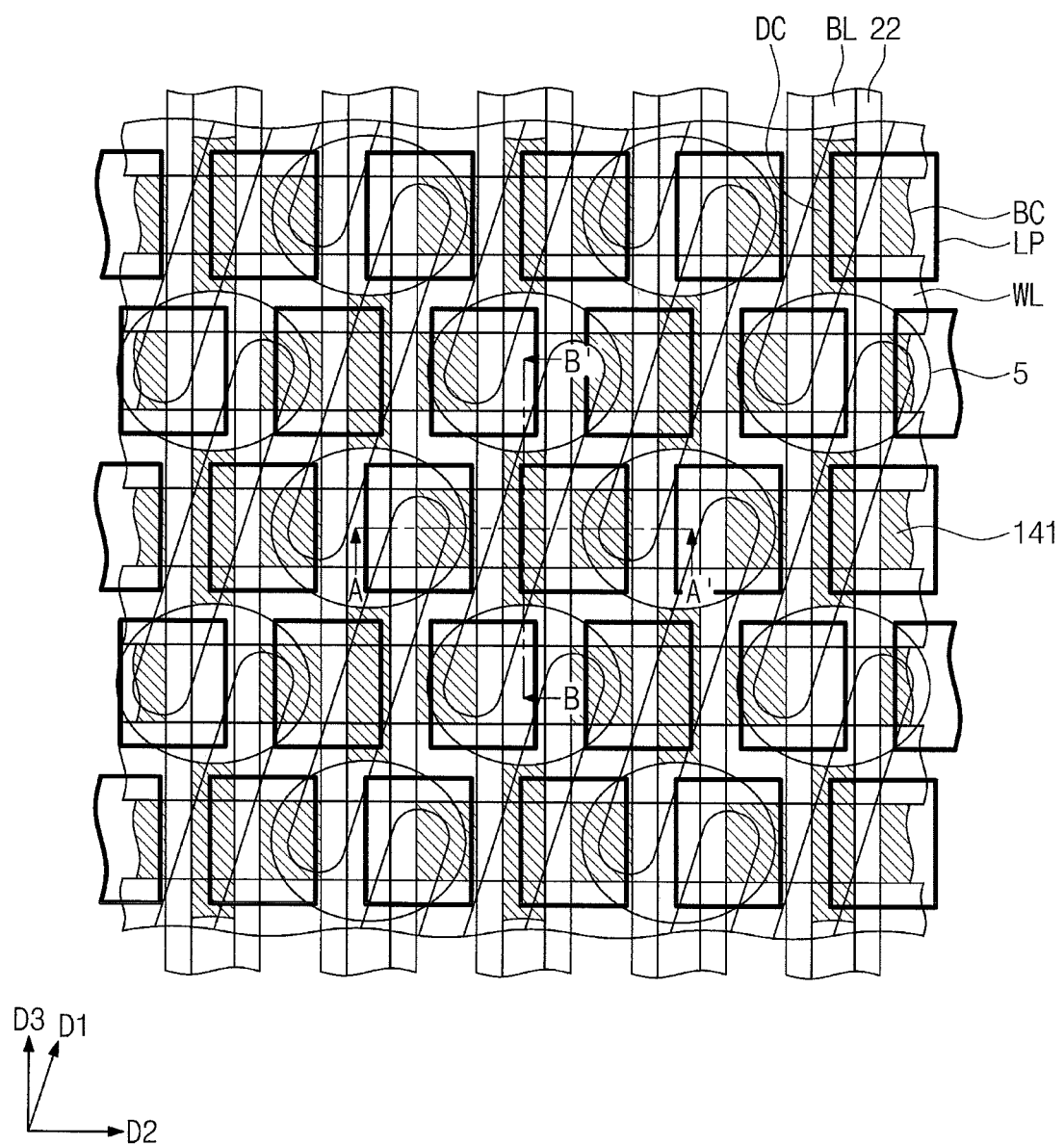
FIG. 1A is a plan view of a semiconductor memory device according to exemplary embodiments of the present inventive concept.
Figure 1B:
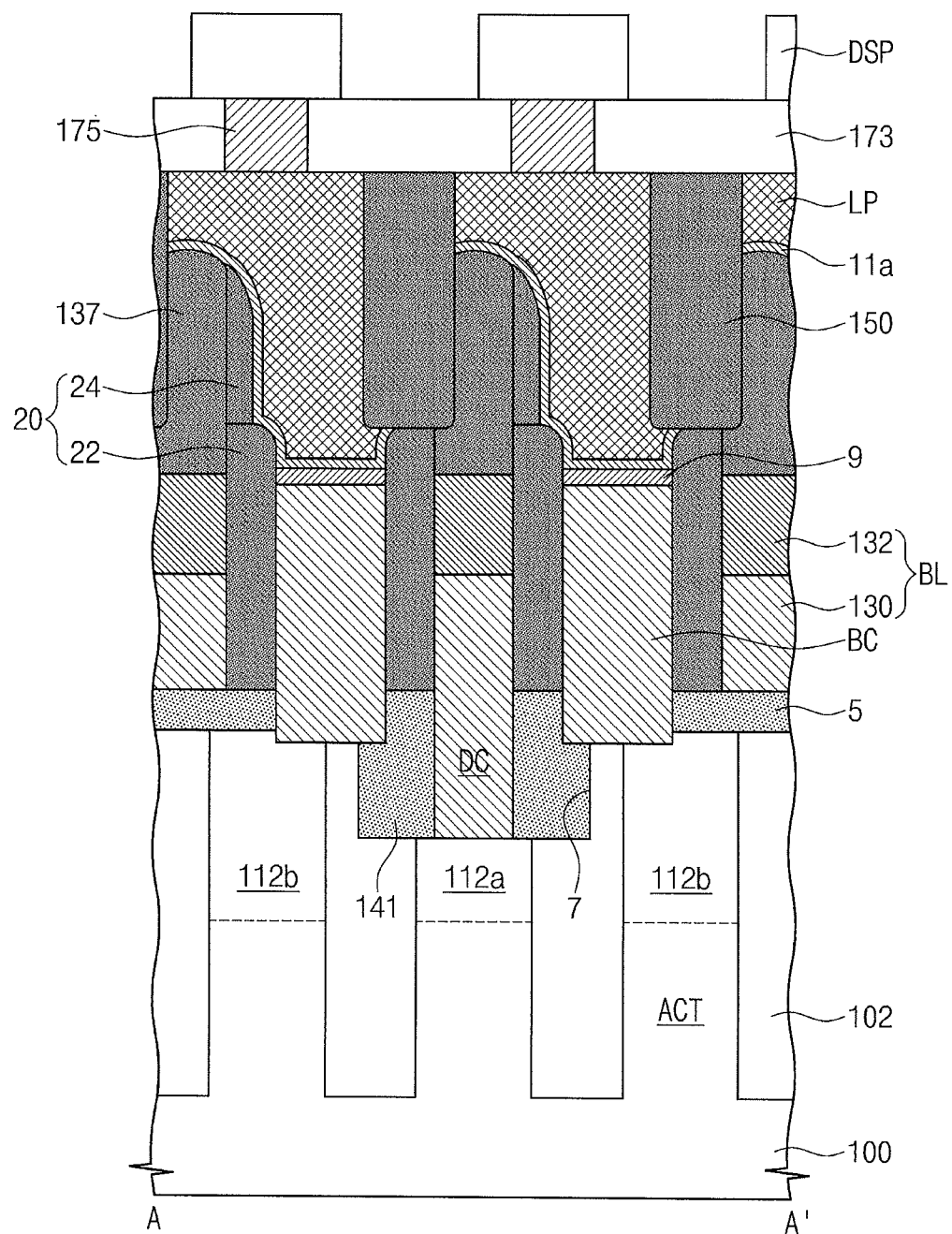
FIG. 1B is a cross-sectional view taken along line A-A' of FIG. 1A.
Figure 1C:
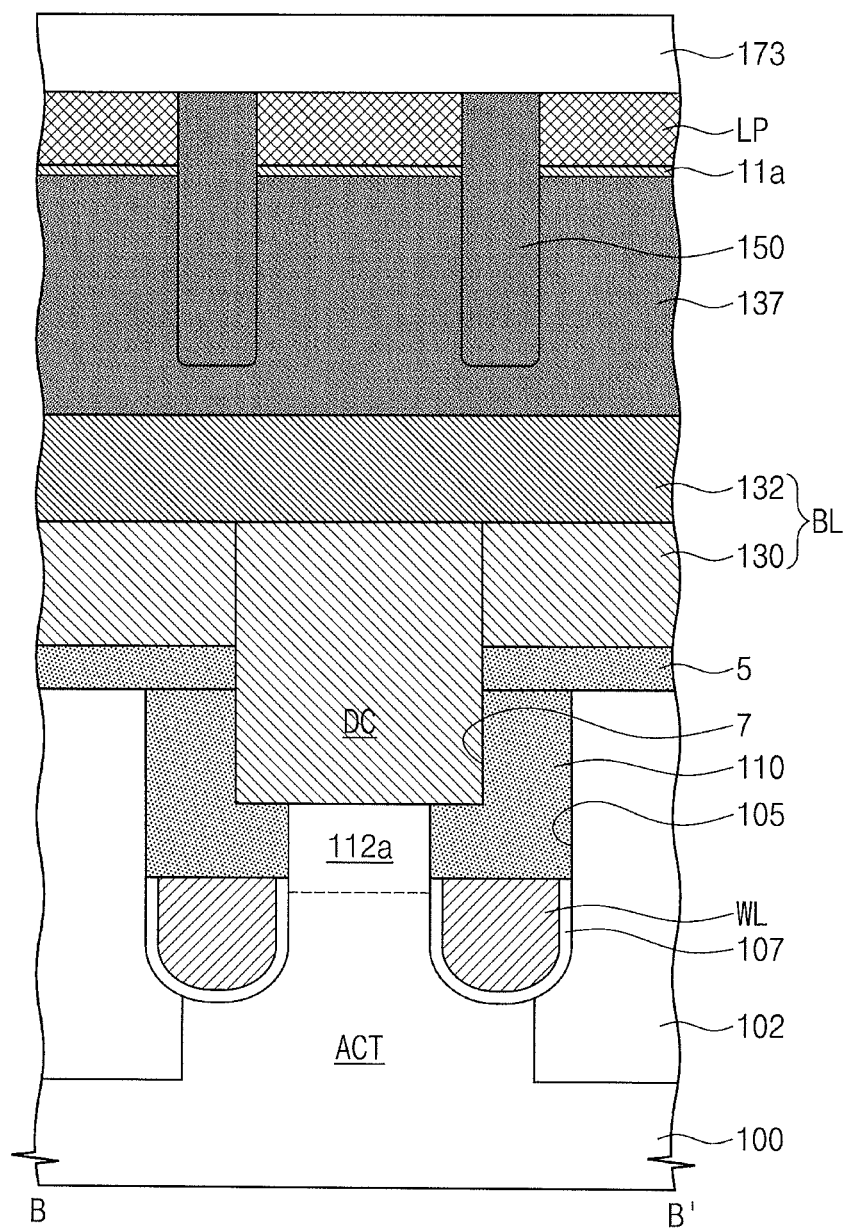
FIG. 1C is a cross-sectional view taken along line B-B' of FIG. 1A.

FIG. 1A is a plan view of a semiconductor volatile memory device according to exemplary embodiments of the present inventive concept. FIG. 1B is a cross-sectional view taken along line A-A' of FIG. 1A. FIG. 1C is a cross-sectional view taken along line B-B' of FIG. 1A.

Referring to FIGS. 1A through 1C, a semiconductor substrate 100 (referred to hereinafter as a substrate) may be provided therein with device isolation patterns 102 that define active sections ACT. Each of the active sections ACT may have a bar shape elongated along a first direction D1, in a plan view. As viewed in plan, the active sections ACT may respectively correspond to portions of the substrate 100 that are surrounded by the device isolation patterns 102. The substrate 100 may include a semiconductor material. For example, the substrate 100 may be a silicon substrate, a germanium substrate, or a silicon-germanium substrate. The device isolation patterns 102 may include oxide (e.g., silicon oxide), nitride (e.g., silicon nitride), and/or oxynitride (e.g., silicon oxynitride). The active sections ACT may be parallel to each other such that one of the active sections ACT may have an end portion adjacent to a central portion of a neighboring one of the active sections ACT.

Word lines WL may cross the active sections ACT. The word lines WL may be disposed within recessed regions 105 formed in the device isolation patterns 102 and the active sections ACT. The word lines WL may be in parallel to a second direction D2 crossing the first direction D1. The word lines WL may be formed of a conductive material. A gate dielectric layer 107 may be disposed between each of the word lines WL and an inner surface of each of the recessed regions 105. Each of the recessed regions 105 may have a floor located relatively deeper in the device isolation pattern 102 and relatively shallower in the active section ACT. The gate dielectric layer 107 may include one or more of thermal oxide, silicon nitride, silicon oxynitride, and high-k dielectric.

A first doped region 112a may be disposed in the active section ACT between a pair of the word lines WL, and a pair of second doped regions 112b may be respectively disposed in opposite edge portions of each of the active sections ACT. The first doped region 112a may correspond to a common drain region, and the second doped regions 112b may correspond to source regions. A transistor may include each of the word lines WL and its adjacent first and second doped regions 112a and 112b. The length of the channel regions under the word lines WL may increase within a limited planar area. It may thus be possible to minimize the short channel effect and the like.

The word lines WL may have top surfaces lower than a top surface of the active sections ACT. A word line capping pattern 110 may be disposed on each of the word lines WL. The word line capping patterns 110 may have linear shapes extending along longitudinal directions of the word lines WL, and cover entire top surfaces of the word lines WL. The recessed regions 105 may have inner spaces unoccupied by the word lines WL, and the word line capping patterns 110 may fill the unoccupied inner spaces of the recessed regions 105.

A first interlayer dielectric pattern 5 may be disposed on the substrate 100. The first interlayer dielectric pattern 5 may be formed of at least one layer or multiple layers selected from a silicon oxide layer, a silicon nitride layer, and a silicon oxynitride layer. The first interlayer dielectric pattern 5 may be formed to have island shapes spaced apart from each other, in a plan view. The first interlayer dielectric pattern 5 may be formed to cover both end portions of two neighboring active sections ACT.

Bit line contact plugs DC may penetrate the first interlayer dielectric pattern 5, and may be respectively disposed in line-contact openings 7 each of which is formed in the substrate 100 and a portion of the device isolation pattern 102. The bit line contact plugs DC may be respectively coupled to the first doped regions 112a. The bit line contact plugs DC may be formed of a conductive material. The bit line contact plugs DC may each have a side wall in contact with a side surface of the first interlayer dielectric pattern 5, as illustrated in FIG. 1C. Referring to the plan view of FIG. 1A, the bit line contact plug DC may have a concave side surface in contact with the first interlayer dielectric pattern 5.

An insulation spacer 141 may be interposed between the bit line contact plug DC and an inner side wall of the line-contact opening 7. The insulation spacer 141 may be formed of a portion of a layer that is part of a bit line BL which will be discussed below. The insulation spacer 141 may be formed of at least one layer or multiple layers selected from the group consisting of a silicon oxide layer, a silicon nitride layer, and a silicon oxynitride layer.

Bit lines BL may be disposed on the first interlayer dielectric pattern 5. The bit lines BL may cross over the word line capping patterns 110 and the word lines WL. As disclosed in FIG. 1A, the bit lines BL may be in parallel to a third direction D3 crossing the first and second directions D1 and D2. The bit lines BL may each include a bit line polysilicon pattern 130 and a bit line metal-containing pattern 132 that are sequentially stacked. The bit line BL may include an upper portion of the bit line contact plug DC. A bit line capping pattern 137 may be disposed on each of the bit lines BL. The bit line polysilicon pattern 130, the bit line metal-containing pattern 132, and the bit line capping pattern 137 can collectively provide a bit line structure having a vertical side wall. The bit lines BL may be coupled to the bit line contact plugs DC arranged in the third direction D3. Alternatively, a portion of the bit line polysilicon pattern 130 may constitute the bit line contact plug DC. The bit lines BL may each be electrically coupled through the bit line contact plug DC to the first doped region 112a. The bit line metal-containing pattern 132 may include one or more of metal (e.g., tungsten, titanium, tantalum, etc.) and conductive metal nitride (e.g., titanium nitride, tantalum nitride, tungsten nitride, etc.). The bit line capping patterns 137 may be formed of an insulating material. For example, the bit line capping patterns 137 may include nitride (e.g., silicon nitride) and/or oxynitride (e.g., silicon oxynitride).

Figure 6A:
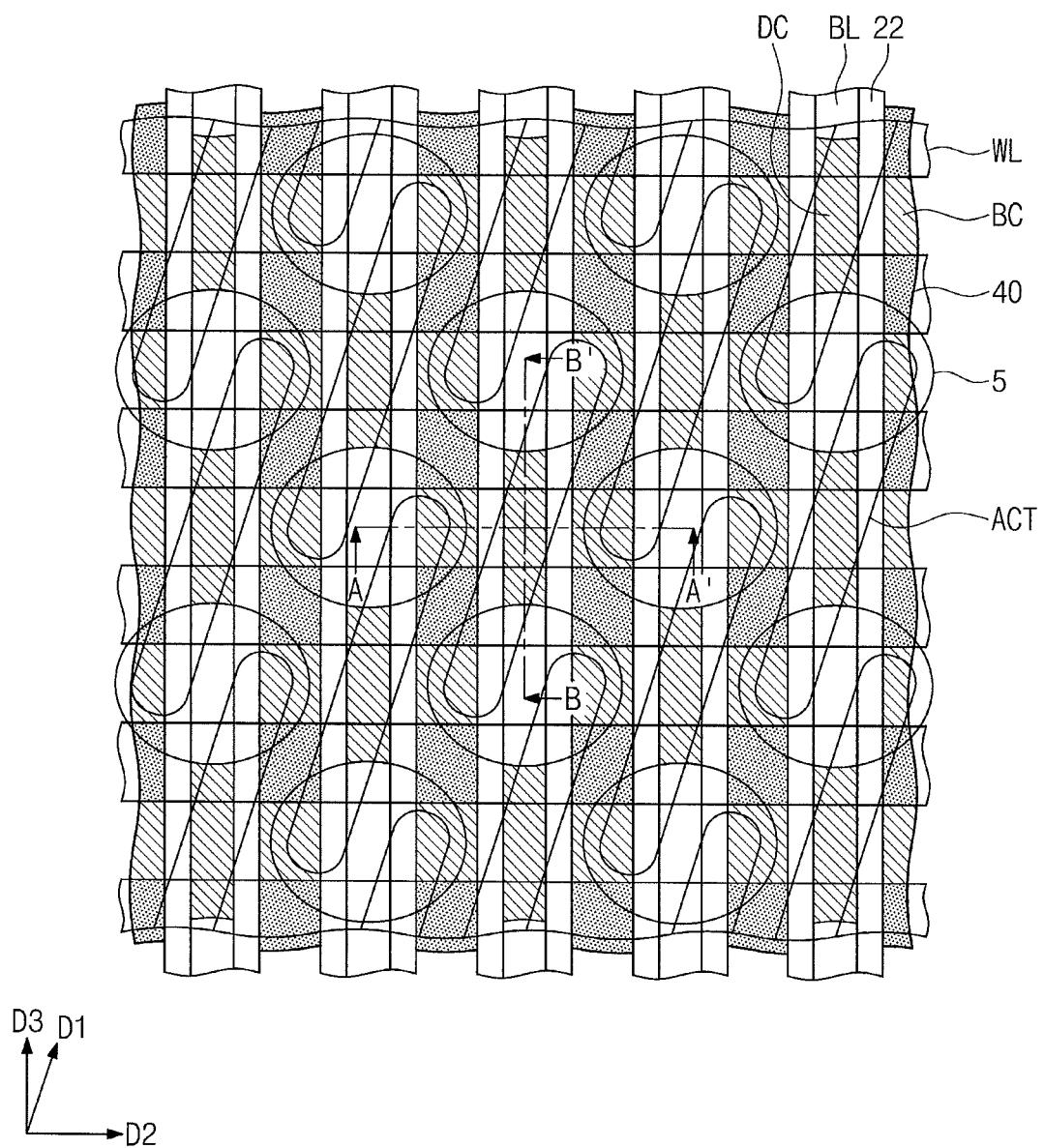

Storage node contact plugs BC may be disposed between a pair of neighboring bit lines BL. The storage node contact plugs BC may be spaced apart from each other. Referring to FIG. 6A, a storage node isolation pattern 40 may be disposed between the storage node contact plugs BC arranged in the third direction D3. The storage node contact plugs BC arranged in the second direction D2 may be provided therebetween with the bit line BL and a bit line spacer 20 covering a side wall of the bit line BL. That is, the bit line spacer 20 may be interposed between the storage node contact plugs BC and the bit lines BL. The bit line spacer 20 may also be interposed between the bit line capping patterns 137 and the storage node contact plugs BC. The bit line spacer 20 may include at least two spacers 22 and 24. For example, the bit line spacer 20 may include a first spacer (i.e., lower spacer) 22 covering the vertical side wall of the bit line BL and a second spacer (i.e., upper spacer) 24 covering the vertical side wall of the bit line capping pattern 137. The second spacer (i.e., upper spacer) 24 may have a bottom surface in contact with a top surface of the first spacer (i.e., lower spacer) 22. In some embodiments, the lower spacer 22 is limited to a lower portion of the vertical side wall of the bit line structure and the upper spacer is limited to an upper portion of the vertical side wall of the bit line structure such that the out surface of the lower spacer is not covered by the upper spacer. In still further embodiments, a thickness of the lower spacer is defined by the distance from the vertical side wall of the bit line structure to an outer side wall of the lower spacer. In some embodiments, a thickness of the upper spacer is defined by the distance from the vertical side wall of the bit line structure to an outer side wall of the upper spacer. In some embodiments, the upper spacer and the lower spacer can be separately formed (i.e., separate spacers). In some embodiments, the thicknesses of the upper and lower spacers can be independent of one another.

The second spacer 24 may have a width less than that of the first spacer 22. In this configuration, the bit line capping patterns 137 may be provided therebetween with the second spacers 24 spaced apart from each other at great intervals, which may increase a formation margin of a landing pad LP which will be discussed below. As a result, it may be possible to prevent non-connection or poor connection between the landing pad LP and the storage node contact plug BC. A lower portion of the vertical side wall of the bit line structure includes a level at an uppermost surface of the storage node contact plug and a level at a lowest surface of the landing pad LP.

The first spacer 22 may include an air gap or a layer having permittivity (or dielectric constant) less than that of the second spacer 24. When the first spacer 22 includes an air gap, the first spacer 22 may have permittivity less than that of silicon oxide. In this case, a parasitic capacitance may be reduced between the storage node contact plugs BC and the bit lines BL. Consequently, it may be possible to achieve a semiconductor device having superior reliability. In addition, since the parasitic capacitance is reduced, the storage node contact plugs BC may be spaced apart from the bit lines BL at reduced intervals such that it may be possible to accomplish a semiconductor device optimized for high integration. The thickness of the lower spacer can be controlled independent of the thickness of the upper spacer to reduce a critical dimension for formation of the storage node contact plug BC.

The storage node contact plug BC may be formed of an impurity-doped polysilicon pattern. An ohmic layer 9 may be disposed on the storage node contact plug BC. The ohmic layer 9 may include metal silicide. The ohmic layer 9, the bit line spacer 20, and the bit line capping pattern 137 may be conformally covered on their top surfaces with a diffusion prevention pattern 11a. The diffusion prevention pattern 11a may include metal nitride. A landing pad LP may be disposed on the diffusion prevention pattern 11a. The landing pad LP may be formed of a metal-containing material. The landing pad LP may have an upper portion that covers the top surface of the bit line capping pattern 137 and has a width greater than that of the storage node contact plug BC. A plurality of landing pad isolation patterns 150 may each be provided to separate neighboring landing pads LP from each other in all of the second and third directions D2 and D3. The landing pad isolation pattern 150 may be formed of at least one selected from, for example, silicon nitride, silicon oxide, and silicon oxynitride. The thickness of the upper spacer can be controlled independent of the thickness of the lower spacer to reduce a critical dimension for formation of the landing pad LP.

A second interlayer dielectric layer 173 may be disposed on the landing pads LP and the landing pad isolation patterns 150. The second interlayer dielectric layer 173 may be formed of, for example, silicon oxide and/or silicon nitride. Data storage parts DSP may be disposed on the second interlayer dielectric layer 173. Each of the data storage parts DSP may be electrically coupled to each of the landing pads LP through a via-plug 175 penetrating the second interlayer dielectric layer 173. Accordingly, each of the data storage parts DSP may be electrically coupled to the second doped region 112b through the landing pad LP and the storage node contact plug BC. In this configuration, the bit line BL and the data storage part DSP may be electrically coupled respectively to the first doped region 112a and the second doped region 112b of each transistor. The data storage part DSP and its connected components may constitute a single memory cell to provide a semiconductor memory device.

In some embodiments, the data storage part DSP may be a capacitor including a bottom electrode, a dielectric layer, and a top electrode. In some embodiments, the data storage part DSP may include a magnetic tunnel junction pattern. In some embodiments, the data storage part DSP may include a phase change material or a variable resistance material.

The data storage part DSP may, however, be any type of structure capable of storing data in a semiconductor memory device.

Hereinafter, there will be explained a method of fabricating the semiconductor memory device discussed with reference to FIGS. 1A through 1C.

FIGS. 2A through 6A are plan views sequentially illustrating a procedure of a method of fabricating the semiconductor memory device of FIG. 1A. FIGS. 2B through 6B are cross-sectional views taken along line A-A' of FIGS. 2A through 6A, respectively. FIGS. 2C through 6C are cross-sectional views taken along line B-B' of FIGS. 2A through 6A, respectively.

Figure 2A:
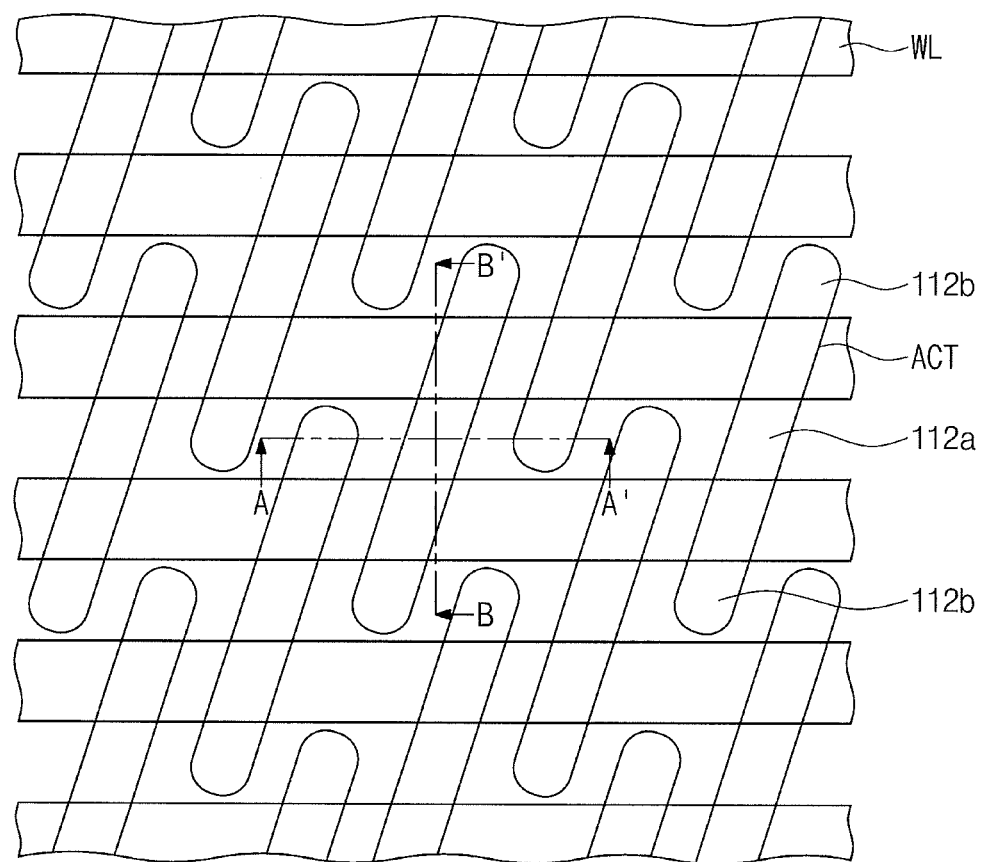
FIGS. 2A, 3A, 4A, 5A, and 6A are plan views illustrating fabricating the semiconductor memory device of FIG. 1A-1C.
Figure 2B:
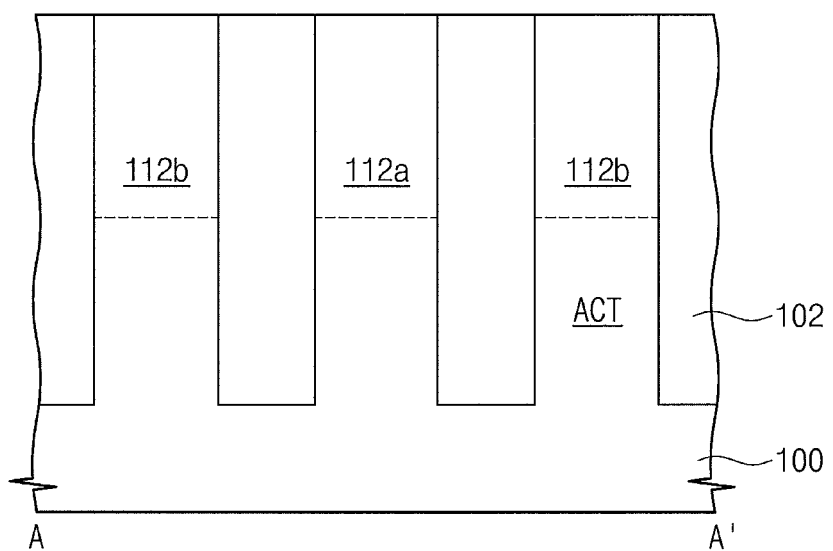
FIGS. 2B, 3B, 4B, 5B, and 6B are cross-sectional views taken along line A-A' of FIGS. 2A through 6A, respectively.
Figure 2C:
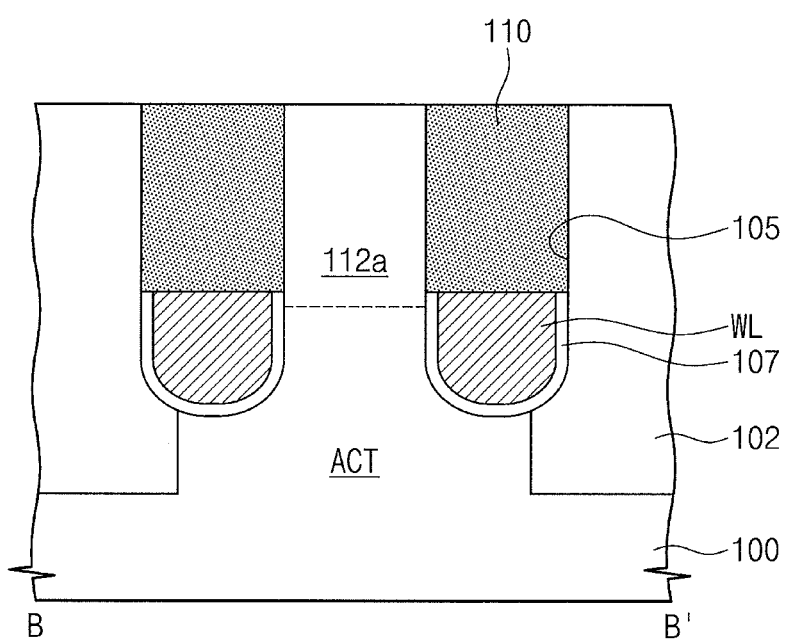
FIGS. 2C, 3C, 4C, 5C, and 6C are cross-sectional views taken along line B-B' of FIGS. 2A through 6A, respectively.

Referring to FIGS. 2A through 2C, active sections 110 may be defined by forming device isolation patterns 120 in a substrate 100. A device isolation trench may be formed in the substrate 100, and the device isolation patterns 102 may fill the device isolation trench. The device isolation patterns 102 may be connected to each other to constitute a single pattern, in a plan view. The active sections ACT may be arranged as discussed above with reference to FIGS. 1A through 1C. The active sections ACT may each be provided at its upper portion with an impurity-doped region by performing an ion implantation process in which the device isolation patterns 102 are used as an ion implantation mask. The active sections ACT and the device isolation patterns 102 may be patterned to form recessed regions 105. The recessed regions 105 may cross the active sections ACT. A pair of the recessed regions 105 may run across each of the active sections ACT. The recessed regions 105 may divide the impurity-doped regions into a plurality of pieces. For example, a pair of the recessed regions 105 may divide the impurity-doped region into a first doped region 112a and a pair of second doped regions 112b. In some embodiments, as disclosed in FIG. 2A, the first doped region 112a may be disposed between the pair of the recessed regions 105, and the pair of second doped regions 112b may be disposed at opposite edges of each of the active sections ACT. A gate dielectric layer 107 may be formed on an inner surface of each of the recessed regions 105. The gate dielectric layer 107 may be formed by thermal oxidation, chemical vapor deposition, and/or atomic layer deposition. A gate conductive layer may be formed to fill the recessed regions 105, and then etched to form word lines WL each of which is provided within each of the recessed regions 105. The word lines WL may have top surfaces recessed lower top surfaces of the active sections ACT. The substrate 100 may be provided thereon with an insulation layer that is deposited to fill the recessed regions 105, and then the insulation layer may be etched to form word line capping patterns 110 each of which is provided on each of the word lines WL.

Figure 3A:
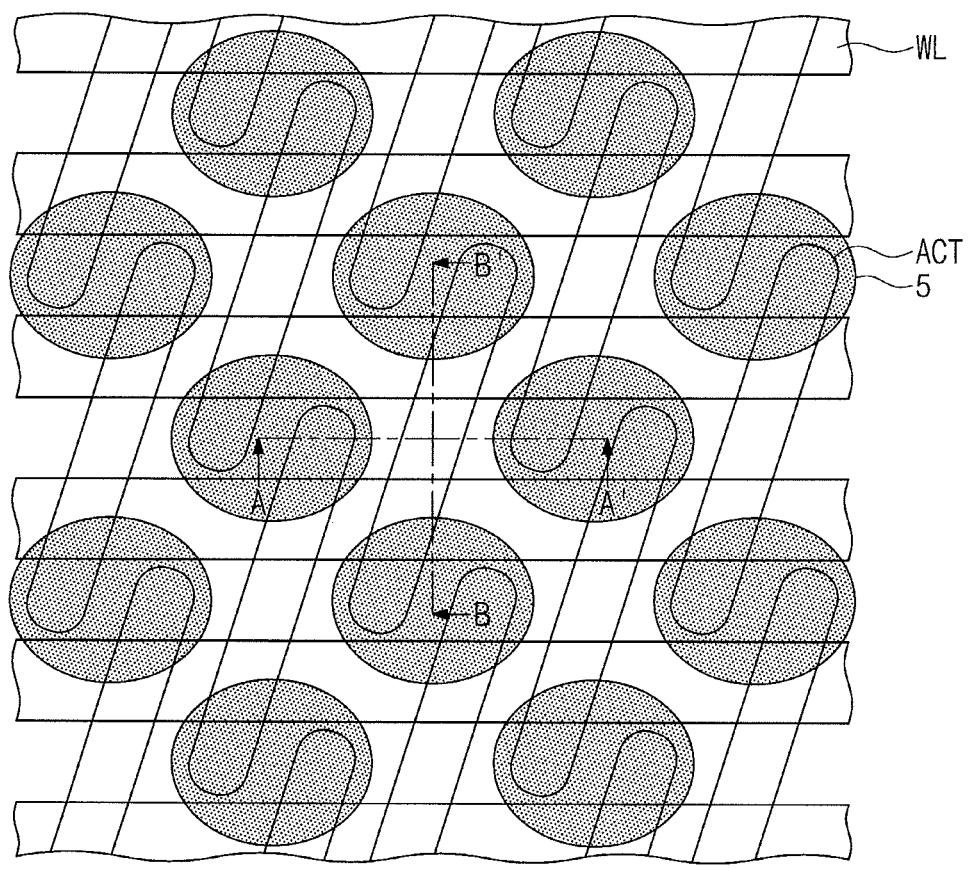
Figure 3B:
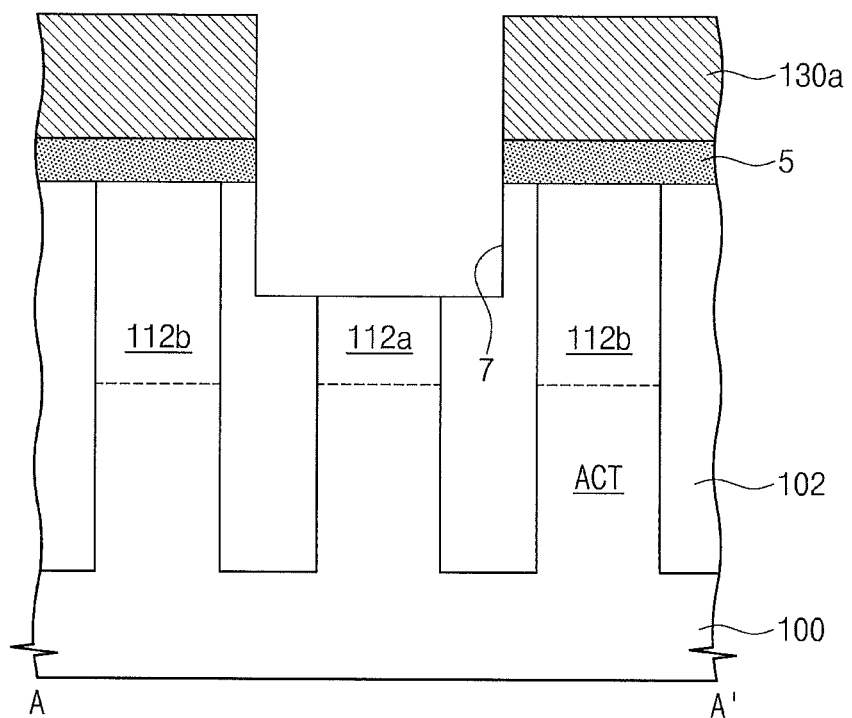
Figure 3C:
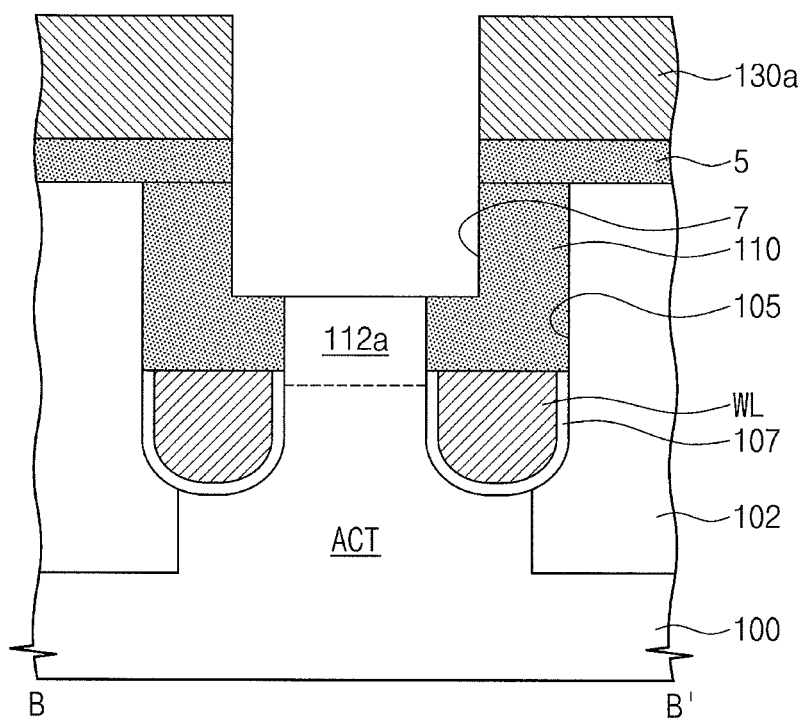

Referring to FIGS. 3A through 3C, an insulation layer and a first polysilicon layer may be sequentially formed on an entire surface of the substrate 100, and may then be patterned to form a first interlayer dielectric pattern 5 and a first polysilicon pattern 130a that are sequentially stacked. The first interlayer dielectric pattern 5 may be formed of at least one layer or multiple layers selected from a silicon oxide layer, a silicon nitride layer, and a silicon oxynitride layer. The first interlayer dielectric pattern 5 may be formed to have island shapes spaced apart from each other. The first polysilicon pattern 130a may also have the same shape of the first interlayer dielectric pattern 5. The first interlayer dielectric pattern 5 may be formed to cover two neighboring second doped regions 112b, i.e., end portions of two neighboring active sections ACT. The first interlayer dielectric pattern 5 and the first polysilicon pattern 130a may be used as an etch mask to partially etch upper portions of the device isolation patterns 102, upper portions of the substrate 100, and upper portions of the word line capping patterns 110, which may form a plurality of recessed regions, i.e., line-contact openings 7. The line-contact openings 7 may be formed to have a net or mesh shape. The line-contact openings 7 may expose the first doped regions 112a.

Figure 4A:
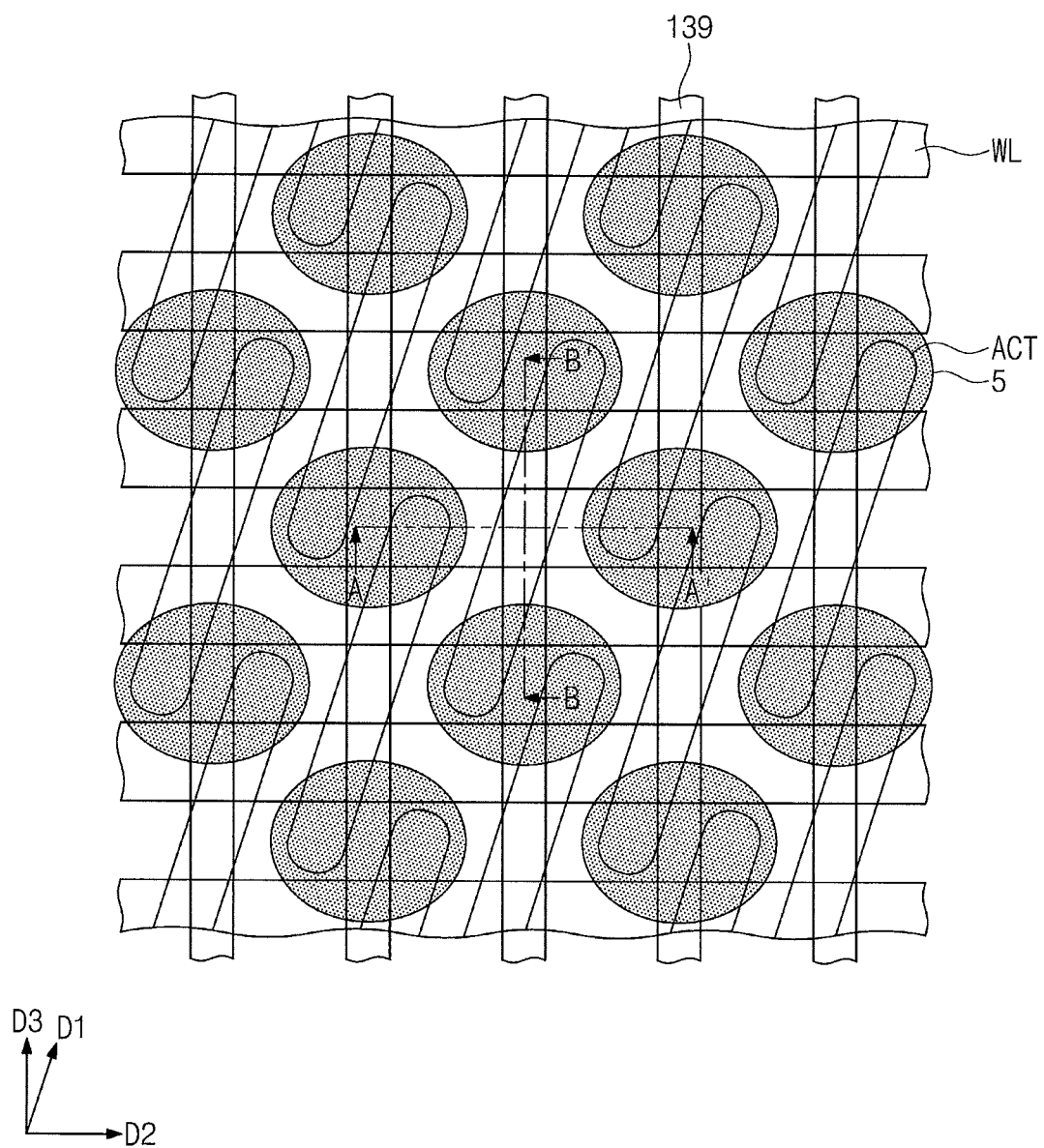
Figure 4B:
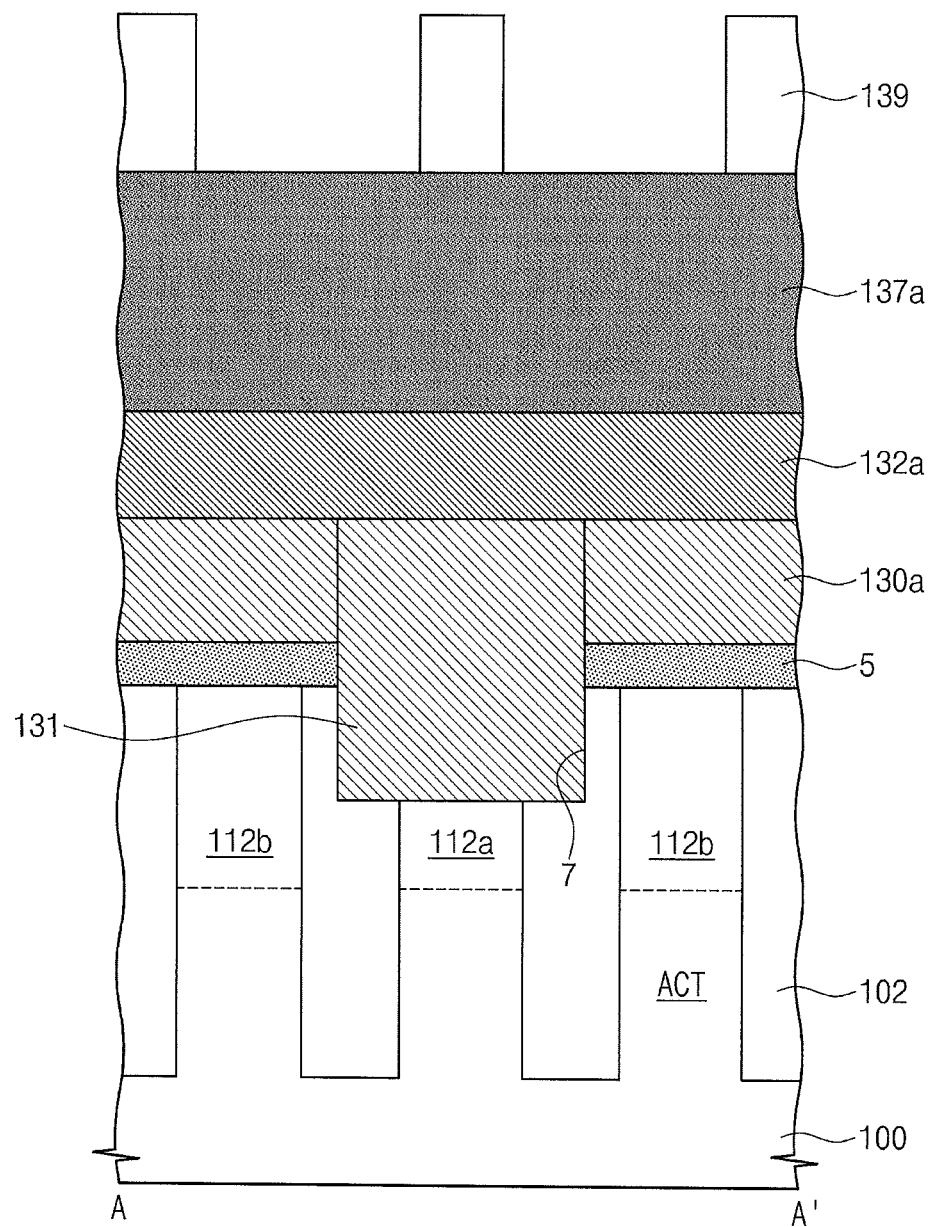
Figure 4C:
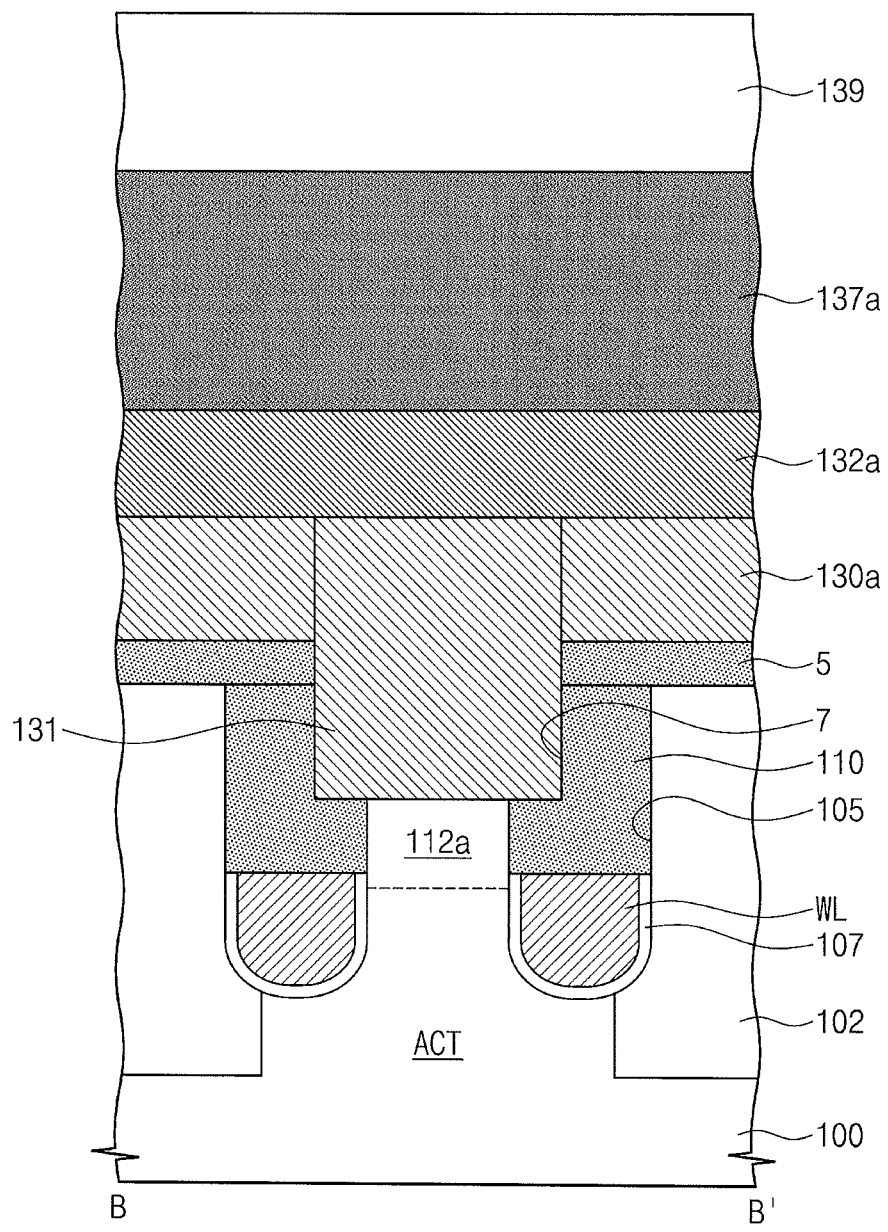

Referring to FIGS. 4A through 4C, the entire surface of the substrate 100 may be covered with a second polysilicon layer filing the line-contact openings 7, and a planarization etching process may be performed to form a second polysilicon pattern 131 within the line-contact opening 7 and to simultaneously expose a top surface of the first polysilicon pattern 130a. A bit line metal-containing layer 132a and a bit line capping layer 137a may be sequentially stacked on the first and second polysilicon patterns 130a and 131. The bit line capping layer 137a may be provided thereon with mask patterns 139 each of which limits a planar shape of a bit line BL which will be discussed below. The mask patterns 139 may be formed of a material, such as a silicon oxide layer or a photoresist pattern, having an etch selectivity to the bit line capping layer 137a.

Figure 5A:
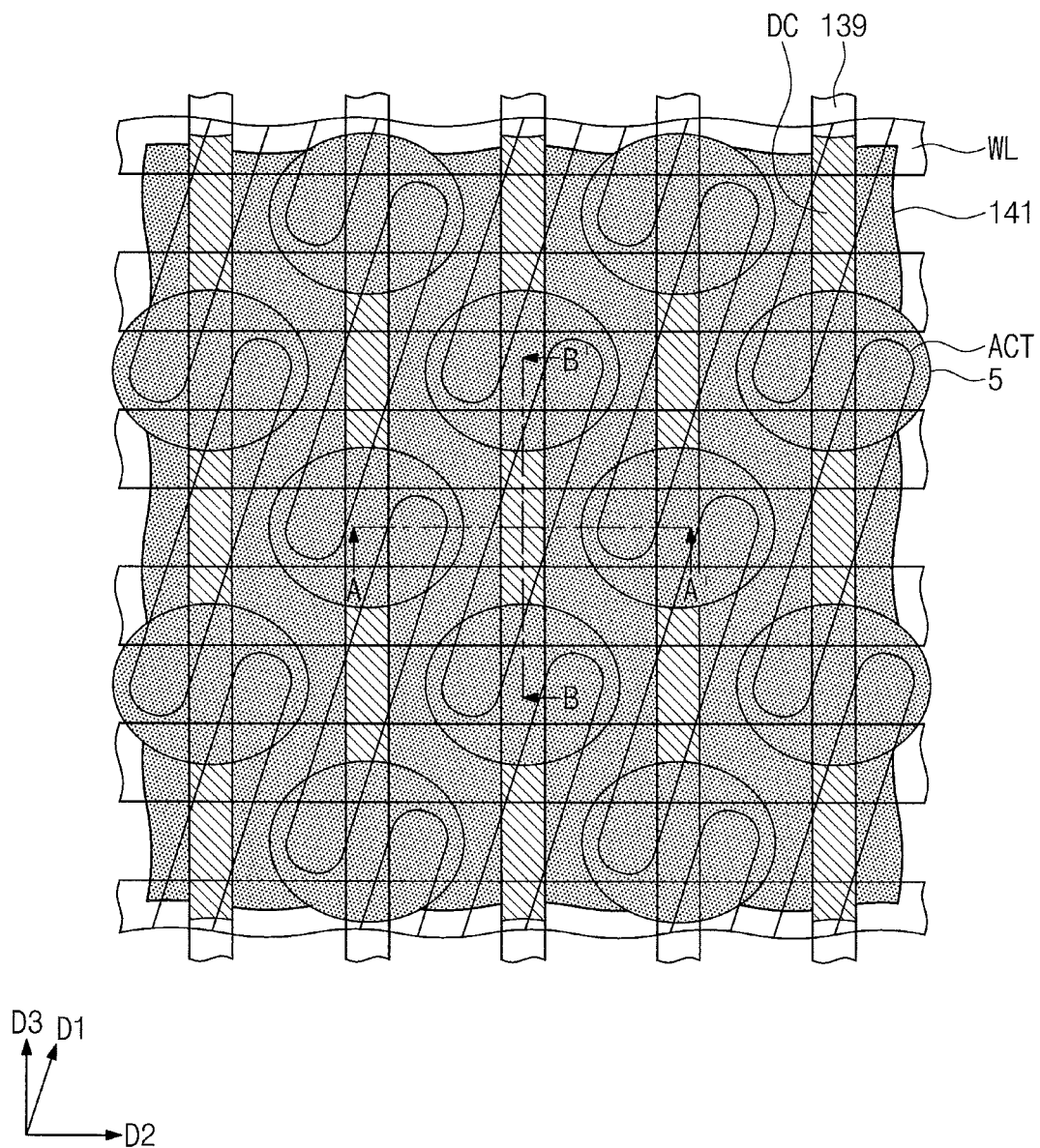
Figure 5B:
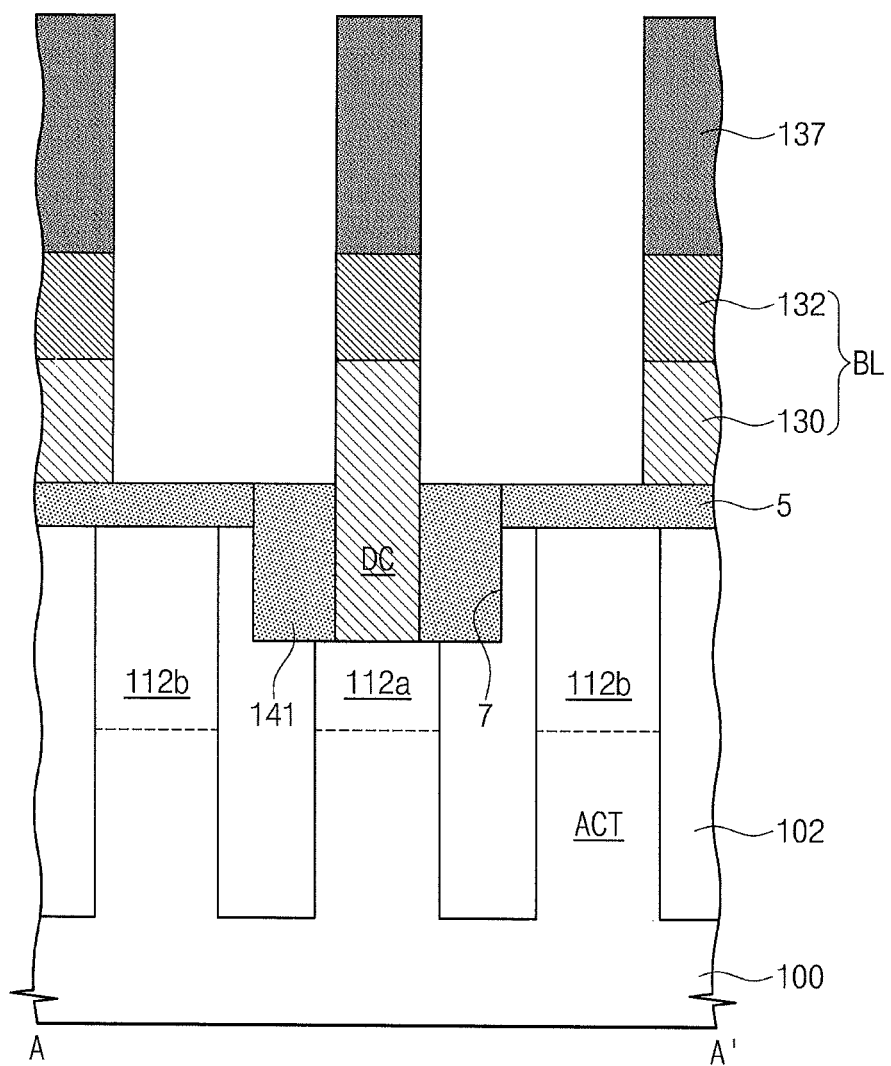
Figure 5C:
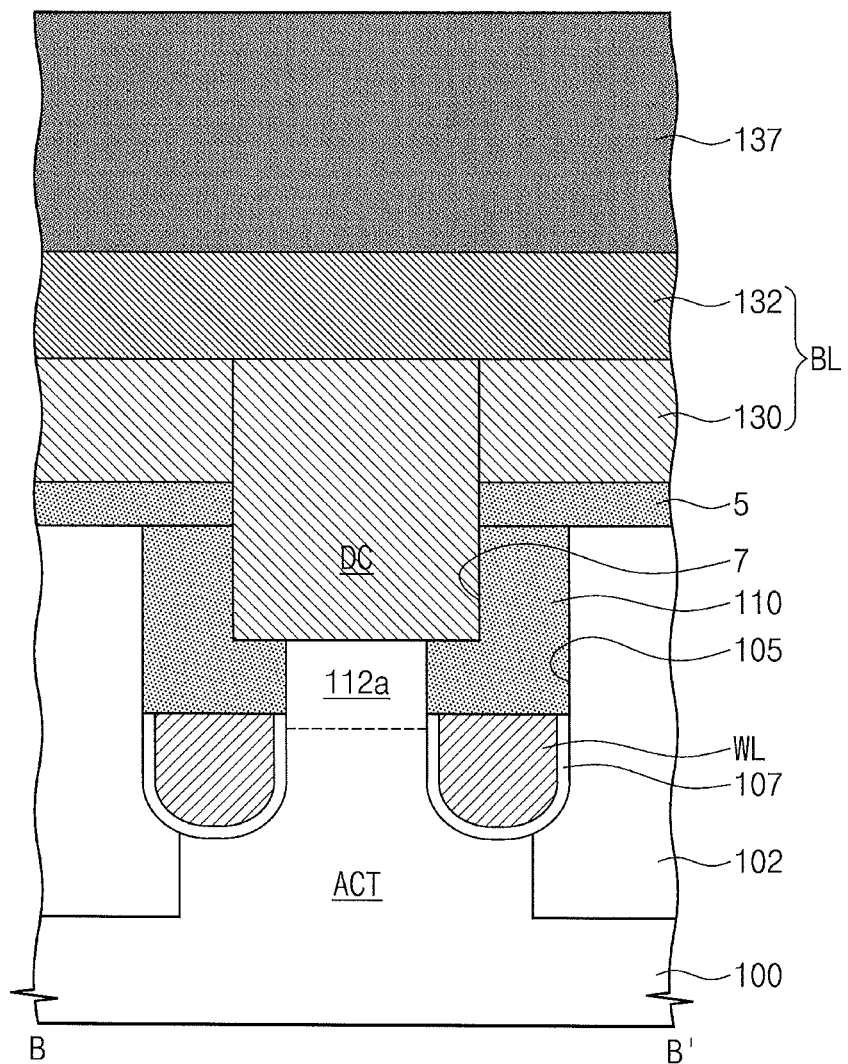

Referring to FIGS. 5A through 5C, the mask patterns 139 may be used as an etch mask to sequentially etch the bit line capping layer 137a, the bit line metal-containing layer 132a, and the first and second polysilicon patterns 130a and 131, which may form a bit line structure BL, a bit line contact plug DC, and a bit line capping pattern 137 having a vertical side wall that protrudes from the substrate 100. The bit line BL may include a bit line polysilicon pattern 130 and a bit line metal-containing pattern 132, and the bit line contact plug DC may include the second polysilicon pattern 131. The aforementioned process may partially expose a top surface of the first interlayer dielectric pattern 5, and also partially expose an inner side wall and a floor surface of the line-contact opening 7. The substrate 100 may be provided on its entire surface with an insulation layer filling between the bit line contact plug DC and the inner side wall of the line-contact opening 7, and then an anisotropic etching process may be performed to form an insulation spacer 141 within the line-contact opening 7. The top surface of the first interlayer dielectric pattern 5 may be exposed between the bit lines BL.

Figure 6B:
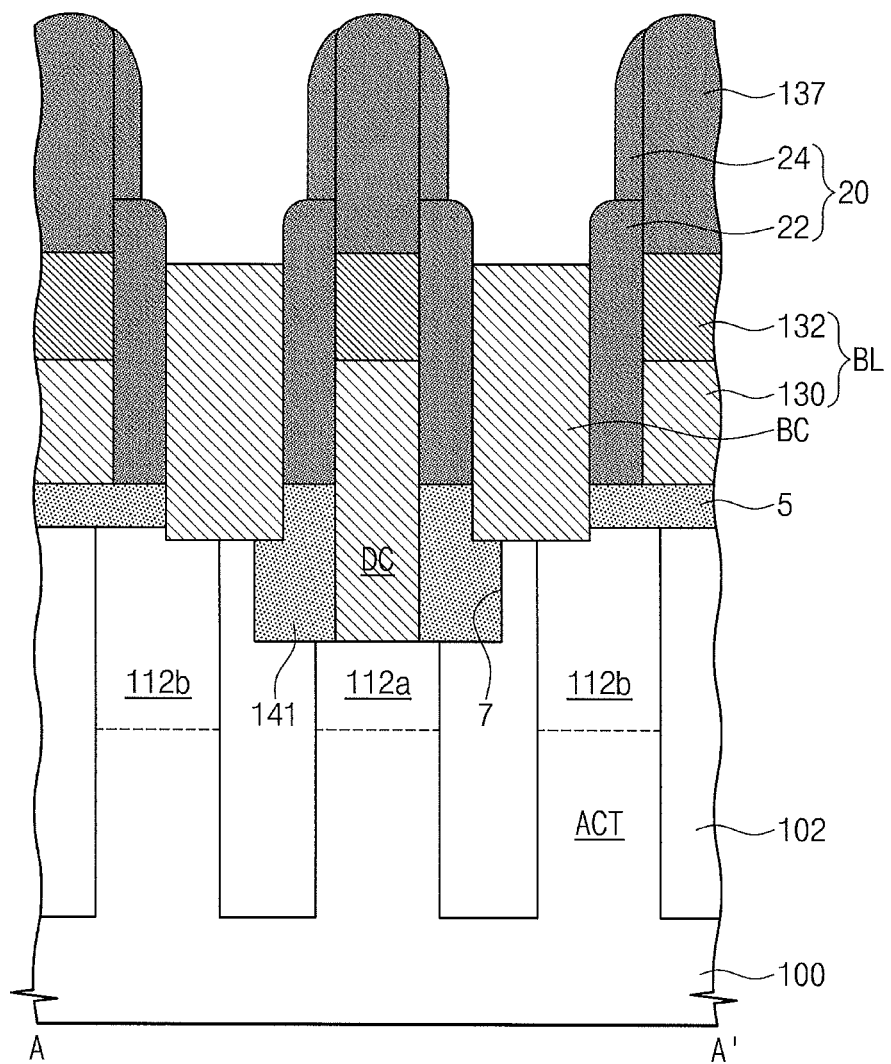
Figure 6C:
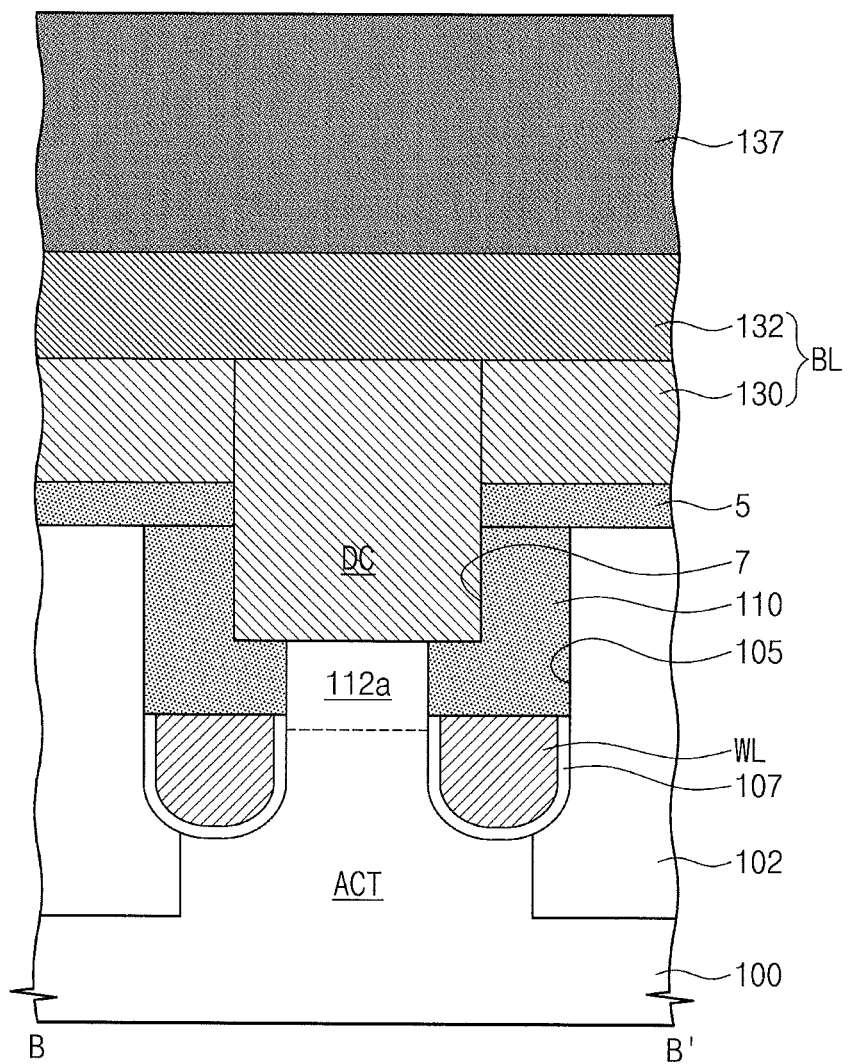

Referring to FIGS. 6A through 6C, a first spacer (lower spacer) layer may be conformally formed on the substrate 100, and may then be etched back from the substrate 100 adjacent to the bit line structure BL to form first spacers (lower spacers) 22 covering vertical side walls of the bit lines BL and vertical side walls of the bit line capping patterns 137 to the first thickness measured from the vertical side wall of the bit line structure to an outer side wall of the lower spacer. In this step, the first interlayer dielectric pattern 5 may be exposed between the first spacers 22. The exposed first interlayer dielectric pattern 5 may be etched to expose the first doped region 112a of the substrate 100. Thereafter, an insulation layer may be stacked on the entire surface of the substrate 100, and may then be patterned to form a storage node isolation pattern 40 defining a storage node contact hole between the first spacers 22. The storage node isolation pattern 40 may be formed of, for example, a silicon nitride layer. The storage node isolation pattern 40 may have a top surface at the same height as that of a top surface of the bit line capping pattern 137. An impurity-doped polysilicon layer may be stacked on the entire surface of the substrate 100 having the storage node isolation pattern 40 formed thereon, and may then be recessed to form a storage node contact plug BC that is disposed aligned to neighboring first spacers (lower spacers) 22 to cover the outer side wall of the lower spacer and has a top surface that is lower than that of the bit line capping pattern 137. An anisotropic etching process may be performed to partially remove an upper portion of the first spacer (lower spacer) 22, and thus the side wall of the bit line capping pattern 137 may be partially exposed. In this step, an upper portion of the bit line capping pattern 137 may also be partially recessed. A second spacer (upper spacer) layer may be conformally formed on the substrate 100, and may then be etched back to form a second spacer (upper spacer) 24 covering the exposed vertical side wall of the bit line capping pattern 137. The second spacer layer may be formed to have a second thickness that is less than that of the first spacer (lower spacer) layer. That is, the second spacer (upper spacer) 24 may have a width less than that of the first spacer (lower spacer) 22. An upper portion of the storage node contact plug BC may also be partially recessed when the etch-back process is performed to form the second spacer 24. The second spacer 24 may be formed also on a side wall of the storage node isolation pattern 40. The upper spacer may also expose an uppermost portion of the outer side wall of the lower spacer.

Referring back to FIGS. 1A through 1C, a metal layer may be formed on a surface of the storage node contact plug BC, and then a heat treatment process may be performed to form a metal silicide layer, i.e., an ohmic layer 9, on the storage node contact plug BC. A diffusion prevention layer may be conformally formed on the entire surface of the substrate 100 having the ohmic layer 9 formed thereon. And then, a metal-containing layer may be formed on the diffusion prevention layer. The metal-containing layer, the diffusion prevention layer, and the second spacer 24 on a side of the bit line BL may be sequentially patterned to form diffusion prevention patterns 11a and landing pads LP and also to form a gap region between the landing pads LP. The landing pads LP and the diffusion prevention patterns 11a may be formed to have island shapes, in a plan view. An insulating material may fill the gap region and may then be planarization-etched to form a landing pad isolation pattern 150 that separates the lading pads LP from each other. A second interlayer dielectric layer 173 may be formed on the landing pad LP and the landing pad isolation pattern 150. The second interlayer dielectric layer 173 may be penetrated with a via-plug 175 in contact with the landing pad LP. The second interlayer dielectric layer 173 may be provided thereon with a data storage part DSP in contact with the via-plug 175.

In a method of fabricating a semiconductor memory device according to embodiments of the present inventive concept, the first spacer (lower spacer) 22 may be formed to a first thickness to cover the side wall of the bit line BL, an upper portion of the first spacer 22 may be removed, and then the second spacer (upper spacer) 24 may be formed to a second thickness on the first spacer (lower spacer) 22. In this manner, the second thickness of the second spacer 24 may be formed independent of the first thickness of the first spacer 22. As a result, a spacing between the second spacers 24 between adjacent bit lines BL may be adjusted in a desired direction.

Figure 7:
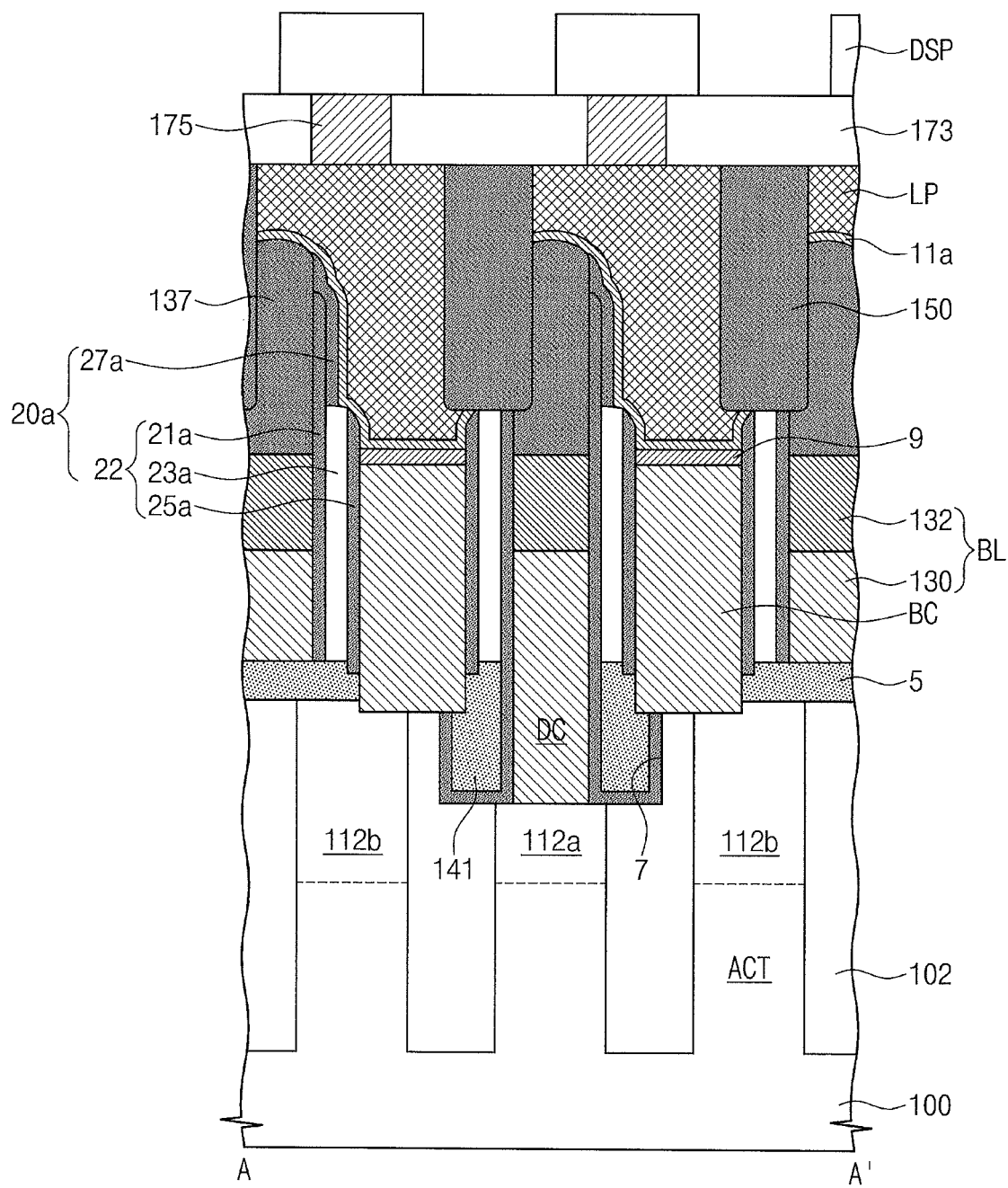
FIG. 7 is a cross-sectional view taken along line A-A' of FIG. 1A according to exemplary embodiments of the present inventive concept.

FIG. 7 is a cross-sectional view taken along line A-A' of FIG. 1A according to exemplary embodiments of the present inventive concept.

Referring to FIG. 7, in a semiconductor memory device according to embodiments of the present inventive concept, a bit line spacer 20a may include a first spacer 22 and a second spacer 27a. The first spacer 22 may include first, second, and third sub-spacers 21a, 23a, and 25a, an uppermost surface of which include respective portions of the second and third sub-spacers 23a, and 25a that cover a portion of the uppermost surface of the lower spacer and exposes a remaining portion of the uppermost surface. The first sub-spacer 21a may cover side surfaces of the bit line BL and the bit line capping pattern 137. The first sub-spacer 21a may cover a side surface of the bit line contact plug DC. The first sub-spacer 21a may extend interposed between the insulation spacer 141 and the bit line contact plug DC and between the insulation spacer 141 and the device isolation pattern 102. That is, the first sub-spacer 21a may extend to cover the inner side wall and the floor surface of each of the line-contact openings 7. The second sub-spacer 23a may cover a side surface of the first sub-spacer 21a. The second sub-spacer 23a may have a top surface lower than that of the first sub-spacer 21a. In this configuration, the first sub-spacer 21a may have an upper side wall that is exposed but not covered with the second sub-spacer 23a. The third sub-spacer 25a may cover a side surface of the second sub-spacer 23a. The second spacer 27a may not be covered with the second sub-spacer 23a, but may cover the exposed side wall of the first sub-spacer 21a. The third sub-spacer 25a and the second sub-spacer 23a can have respective thicknesses that together provide a combined thickness that is less than an upper thickness of the second spacer 27a. The second spacer 27a may have a bottom surface in contact with the top surface of the second sub-spacer 23a. Accordingly, an uppermost surface of the first sub-spacer 21a may be partially covered by a lowest surface of the upper spacer (i.e., second spacer 27a). The second sub-spacer 23a may have a width greater than those of the first and third sub-spacers 21a and 25a and also greater than that of the second spacer 27a. The second sub-spacer 23a may have permittivity (or dielectric constant) less than those of the first and third sub-spacers 21a and 25a and also less than that of the second spacer 27a. For example, a silicon nitride layer may be employed to form the first and third sub-spacers 21a and 25a and the second spacer 27a. The second sub-spacer 23a may be a silicon oxide layer or an air gap. Other configurations may be identical or similar to those discussed with reference to FIGS. 1A through 1C.

FIGS. 8A through 8D are cross-sectional views sequentially illustrating a procedure of a method of fabricating a semiconductor memory device having the cross-section of FIG. 7.

Figure 8A:
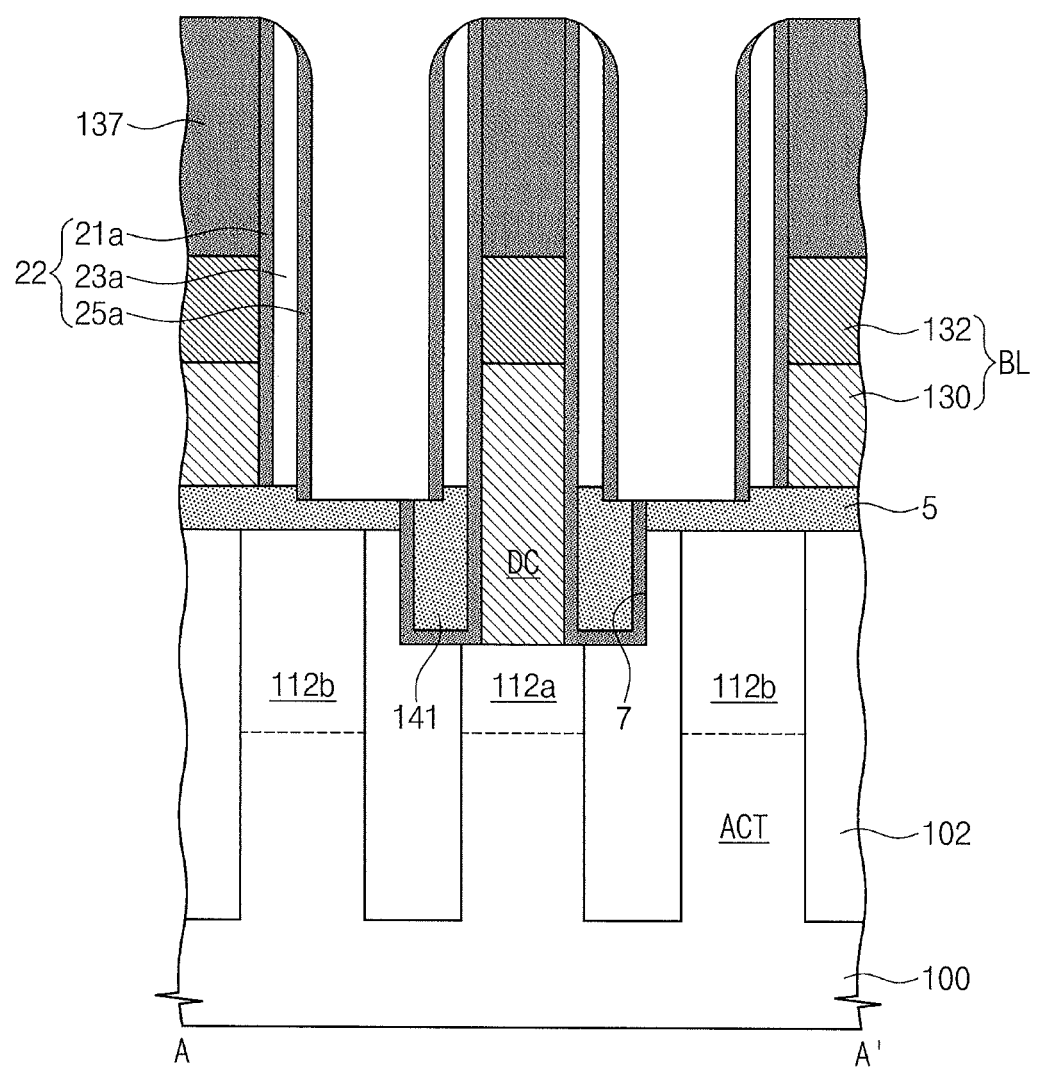
FIGS. 8A through 8D are cross-sectional views illustrating fabricating a semiconductor memory device having the cross-section of FIG. 7.

Referring to FIG. 8A, the mask patterns 139 may be provided on the existing structure as illustrated in FIG. 4B and used as an etch mask to sequentially etch the bit line capping layer 137a, the bit line metal-containing layer 132a, and the first and second polysilicon patterns 130a and 131, which may form a bit line BL, a bit line contact plug DC, and a bit line capping pattern 137. The bit line BL may include a bit line polysilicon pattern 130 and a bit line metal-containing pattern 132, and the bit line contact plug DC may include the second polysilicon pattern 131. The aforementioned process may partially expose a top surface of the first interlayer dielectric pattern 5, and also partially expose an inner side wall and a floor surface of the line-contact opening 7. A first sub-spacer layer may be conformally formed on the entire surface of the substrate 100. The first sub-spacer layer may conformally cover the floor surface and the inner side wall of the line-contact opening 7. The substrate 100 may be provided on its entire surface with an insulation layer filling between the bit line contact plug DC and the inner side wall of the line-contact opening 7, and then an anisotropic etching process may be performed to form a first sub-spacer 21a and an insulation spacer 141 within the line-contact opening 7. A second sub-spacer layer may be conformally formed on the entire surface of the substrate 100, and then an anisotropic etching process may be performed to form a second sub-spacer 23a. After that, a third sub-spacer layer may be conformally formed on the entire surface of the substrate 100, and then an anisotropic etching process may be performed to form a third sub-spacer 25a. A first spacer 22 may be constituted by the first sub-spacer 21a, the second sub-spacer 23a, and the third sub-spacer 25a. The first interlayer dielectric pattern 5 may be exposed between the first spacers 22.

Figure 8B:
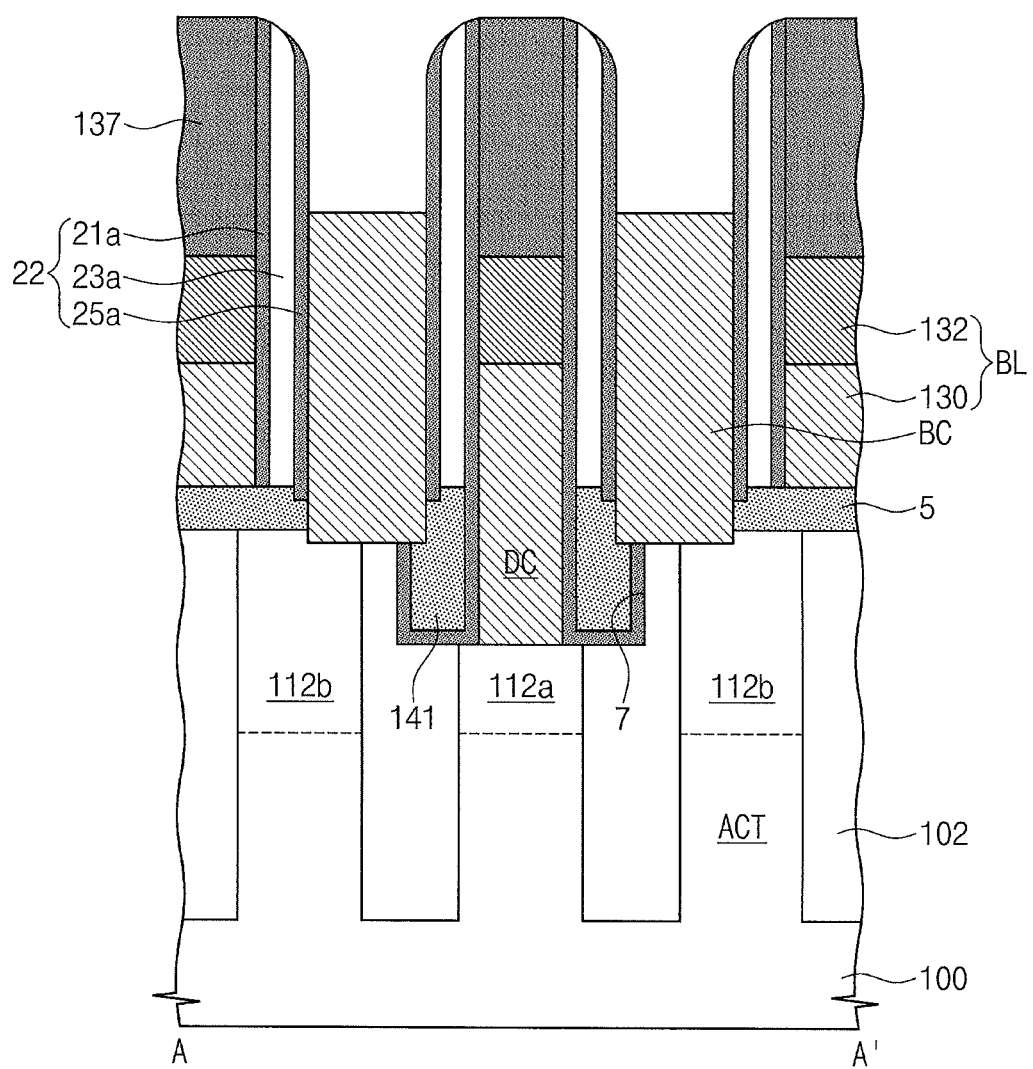

Referring to FIGS. 8A and 8B, an etching process may be performed on the first interlayer dielectric pattern 5 exposed between the first spacers 22, which may expose the second doped region 112b of the substrate 100. An insulation layer may be stacked on the entire surface of the substrate 100, and may then be patterned to form a storage node isolation pattern 40 defining a storage node contact hole between the third sub-spacers 25a. An impurity-doped polysilicon layer may be stacked on the entire surface of the substrate 100, and may then be recessed to form a storage node contact plug BC between the bit lines BL.

Figure 8C:
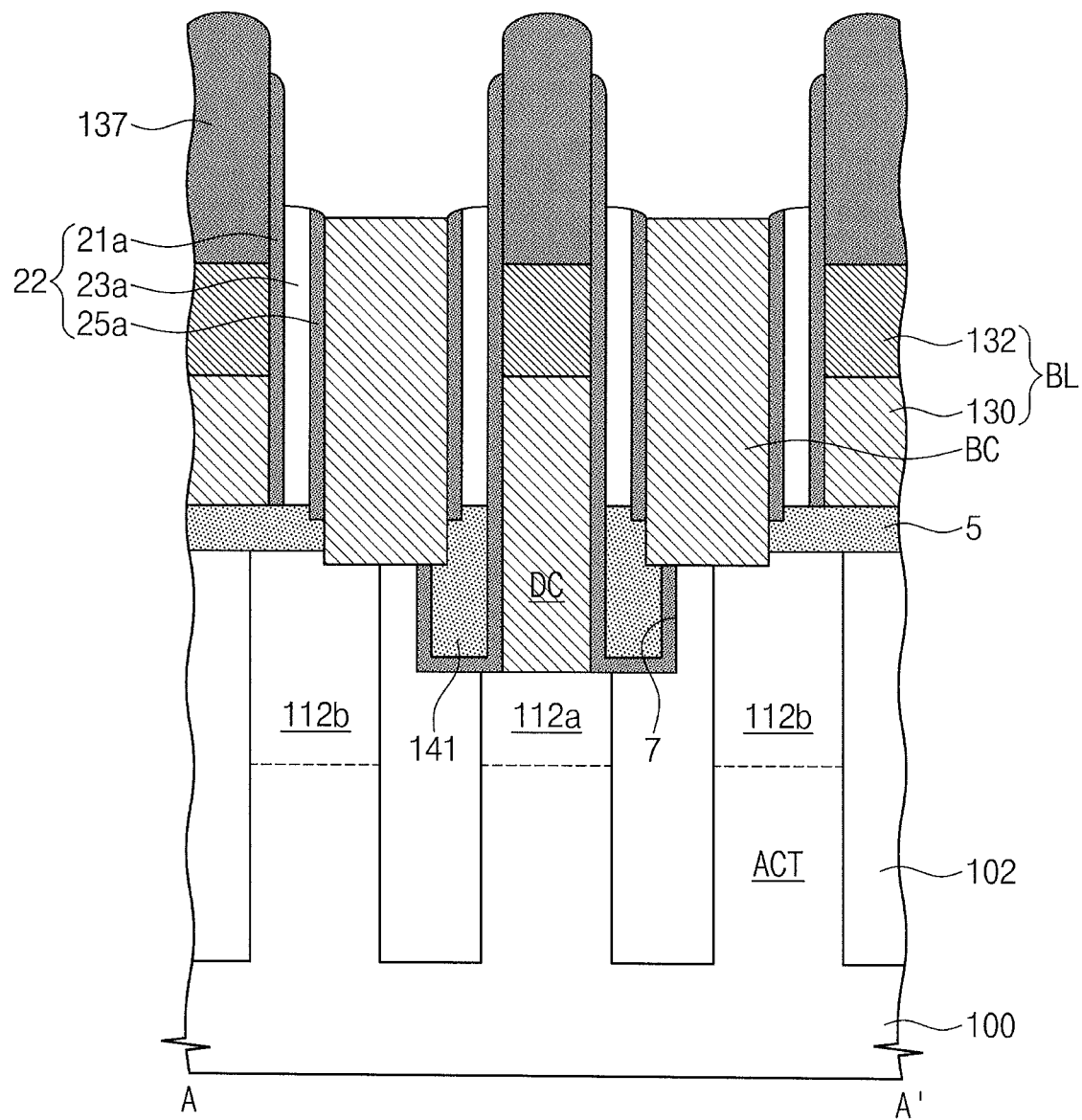

Referring to FIG. 8C, an anisotropic etching process may be performed on the third sub-spacer 25a to remove an upper portion of the third sub-spacer 25a and to expose a side wall of the second sub-spacer 23a. An anisotropic etching process may be performed on the second sub-spacer 23a to remove an upper portion of the second sub-spacer 23a and to expose a side wall of the first sub-spacer 21a. The second sub-spacer 23a may have a top end whose height is identical or similar to that of a top end of the third sub-spacer 25a. The upper portions of the third and second spacers 25a and 23a may be sequentially etched in different steps or simultaneously etched in a single anisotropic/isotropic etching process. The aforementioned etching process may also partially remove an upper portion of each of the bit line capping pattern 137 and the first sub-spacer 21a. In addition, an upper portion of the storage node contact plug BC may also be removed.

Figure 8D:
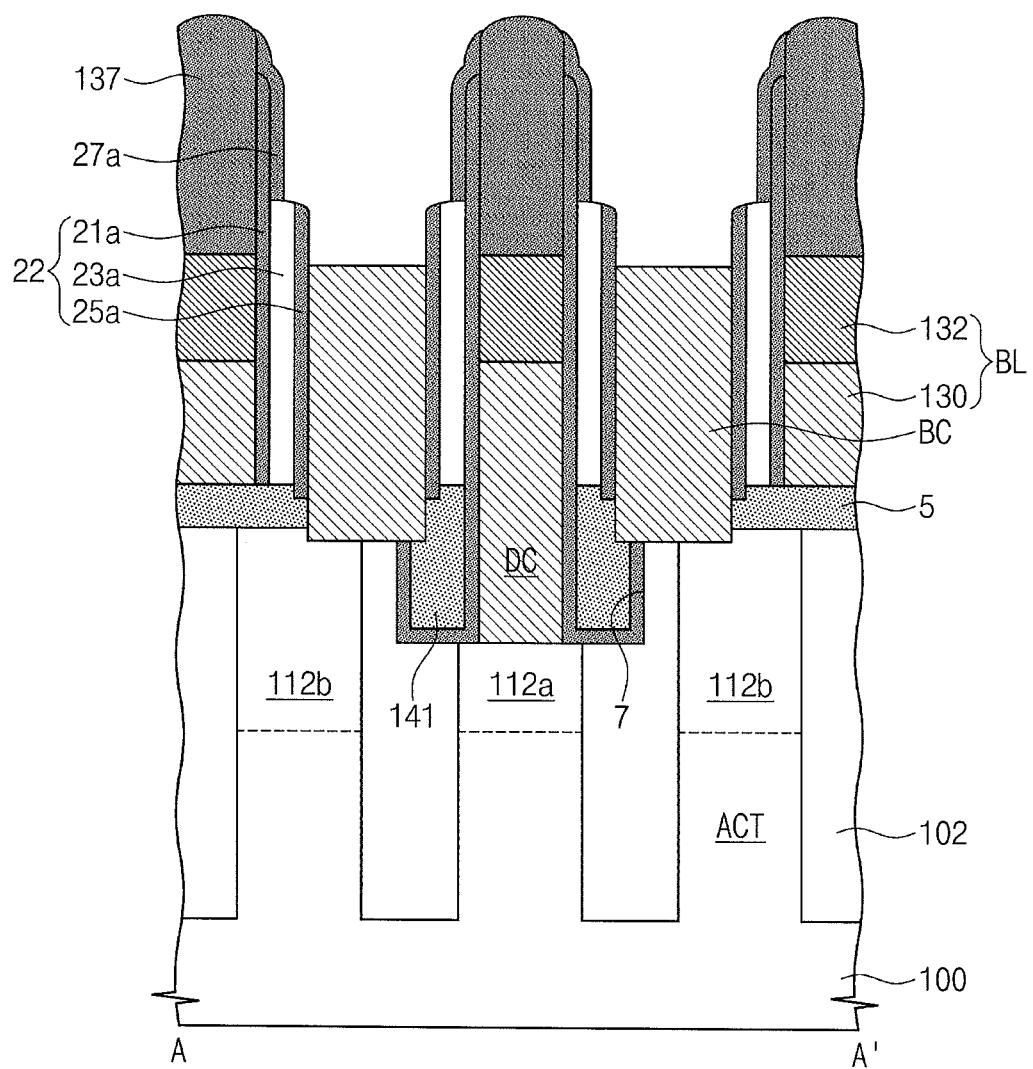

Referring to FIG. 8D, a second spacer layer may be conformally formed on the entire surface of the substrate 100, and then an anisotropic etching process may be performed to form a second spacer 27a covering the exposed side wall of the first sub-spacer 21a. The second spacer layer may be formed to have a thickness less than the second sub-spacer layer. That is, the second spacer 27a may have a width less than that of the second sub-spacer 23a. The second sub-spacer 23a may therefore be partially exposed on its top surface. Although not show in figures, the second spacer 27a may be formed to cover a side wall of the storage node isolation pattern 40. An upper portion of the storage node contact plug BC may also be partially removed when the anisotropic etching process is performed to form the second spacer 27a. Alternatively, an upper portion of the storage node contact plug BC may be additionally recessed. Thereafter, subsequent processes will be performed as discussed with reference to FIGS. 1A through 1C.

Figure 9:
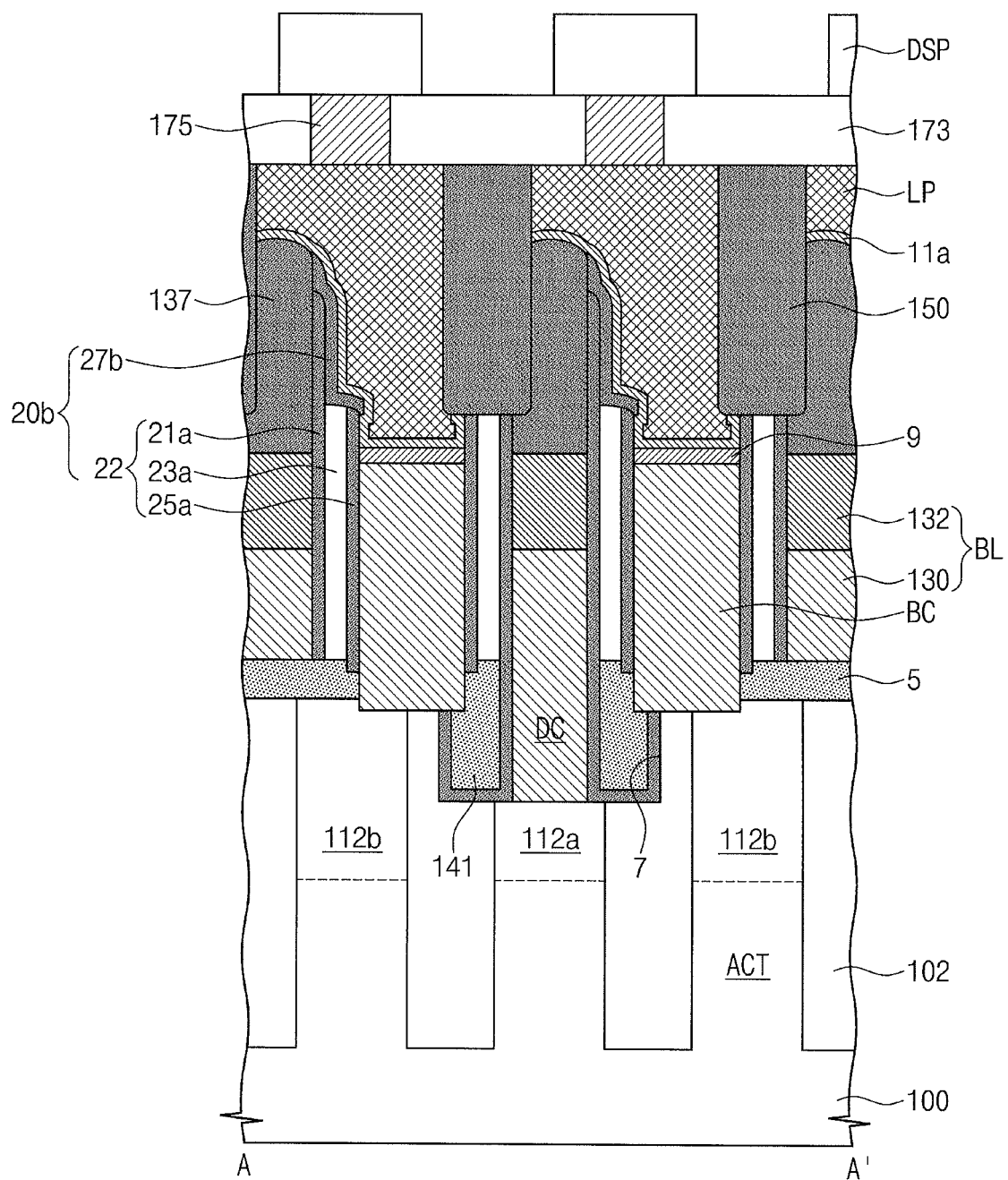
FIG. 9 is a cross-sectional view taken along line A-A' of FIG. 1A according to exemplary embodiments of the present inventive concept.

FIG. 9 is a cross-sectional view taken along line A-A' of FIG. 1A according to exemplary embodiments of the present inventive concept.

Referring to FIG. 9, in a semiconductor memory device according to embodiments of the present inventive concept, a bit line spacer 20b may include a first spacer 22 and a second spacer 27b. The first spacer 22 may include first, second, and third sub-spacers 21a, 23a, and 25a. The second spacer 27b may have an end portion that extends to cover top surfaces of the second and third sub-spacers 23a and 25a.

The second spacer 27b may include a first segment covering a side wall of the first sub-spacer 21a and a second segment covering the top surfaces of the second and third sub-spacers 23a and 25a, and each of the first and second segments may have an "L" shape. The second spacer 27b may have a lower side surface that is aligned with or protrudes outside a side wall of the third sub-spacer 25a. Other configurations may be identical or similar to those discussed with reference to FIG. 7.

Figure 10A:
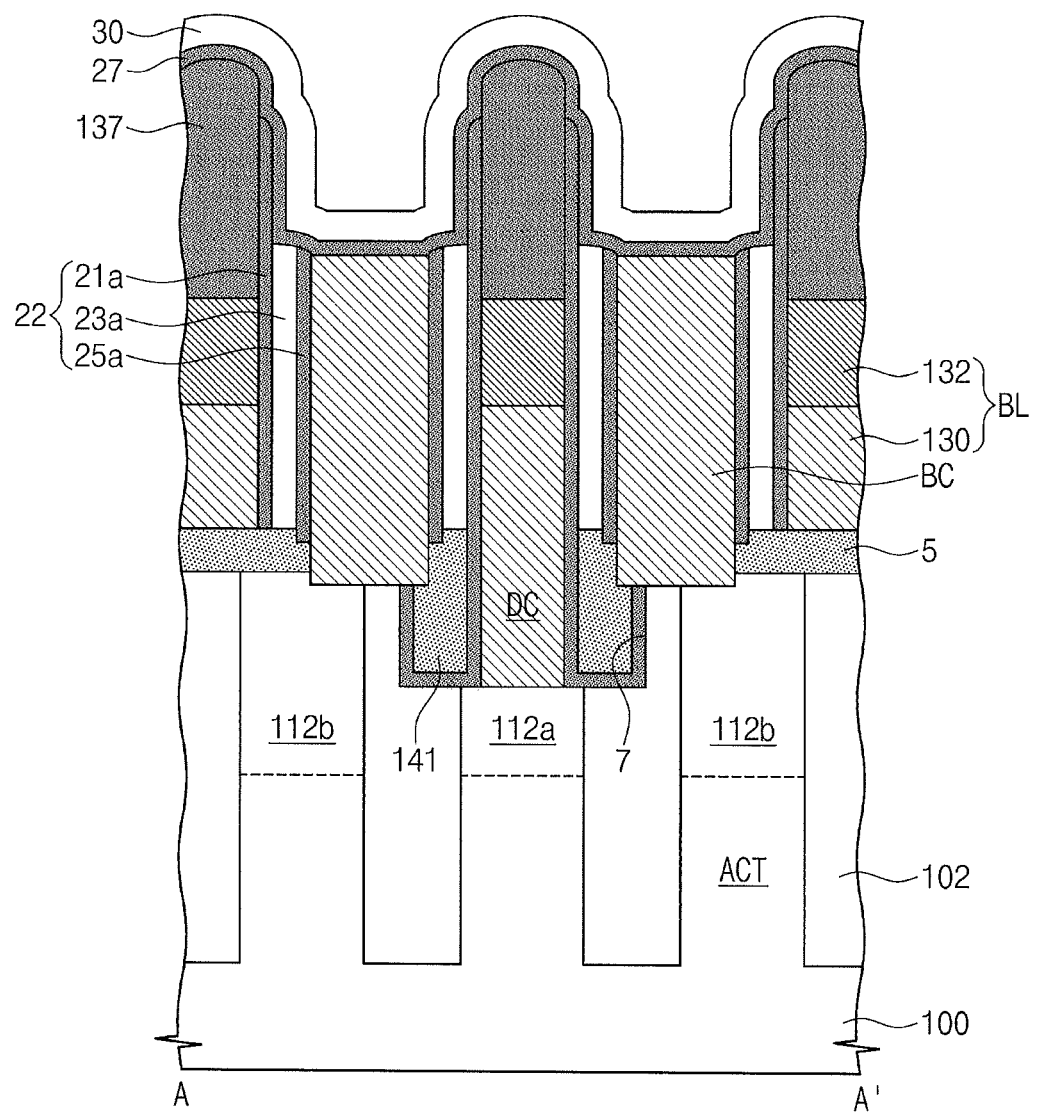
FIGS. 10A through 10C are cross-sectional views illustrating fabricating the semiconductor memory device of FIG. 9.
Figure 10B:
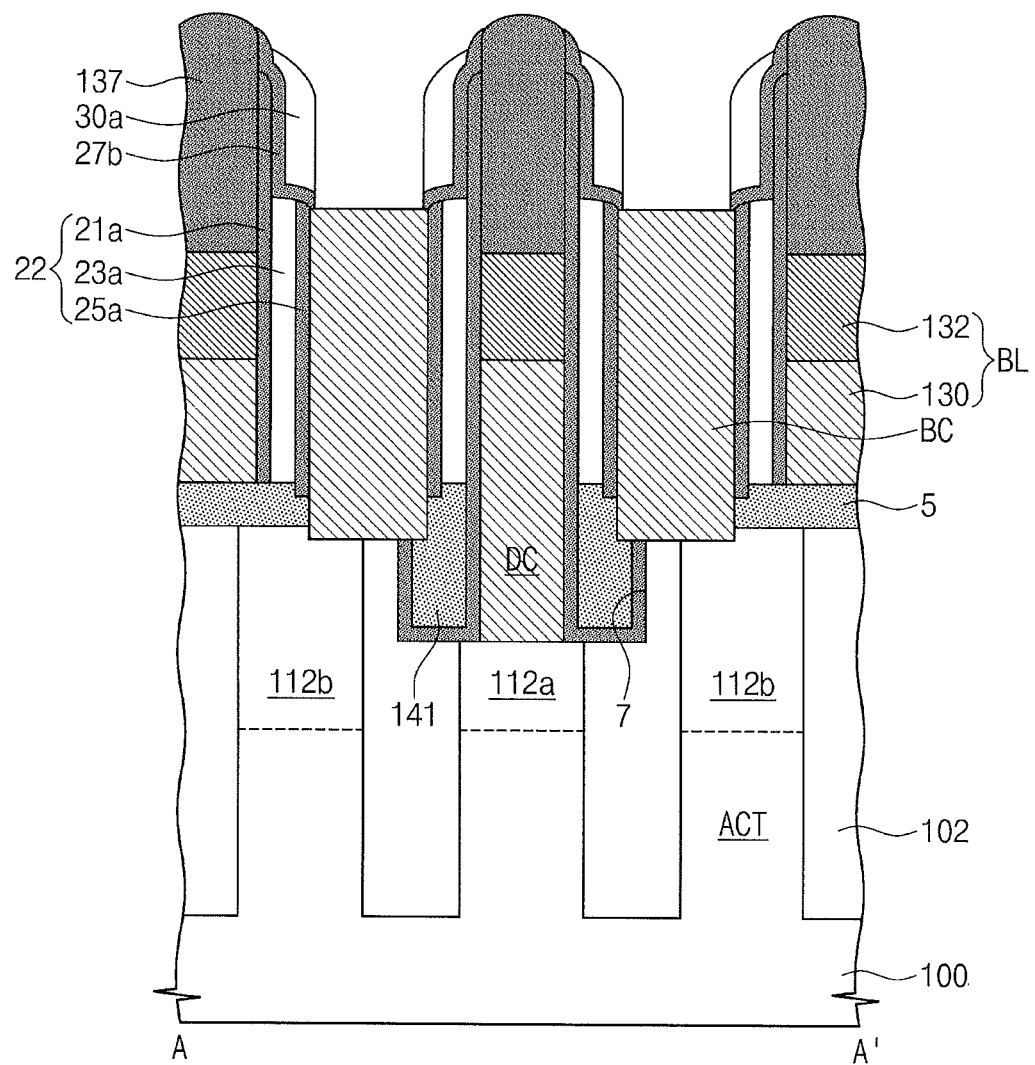
Figure 10C:
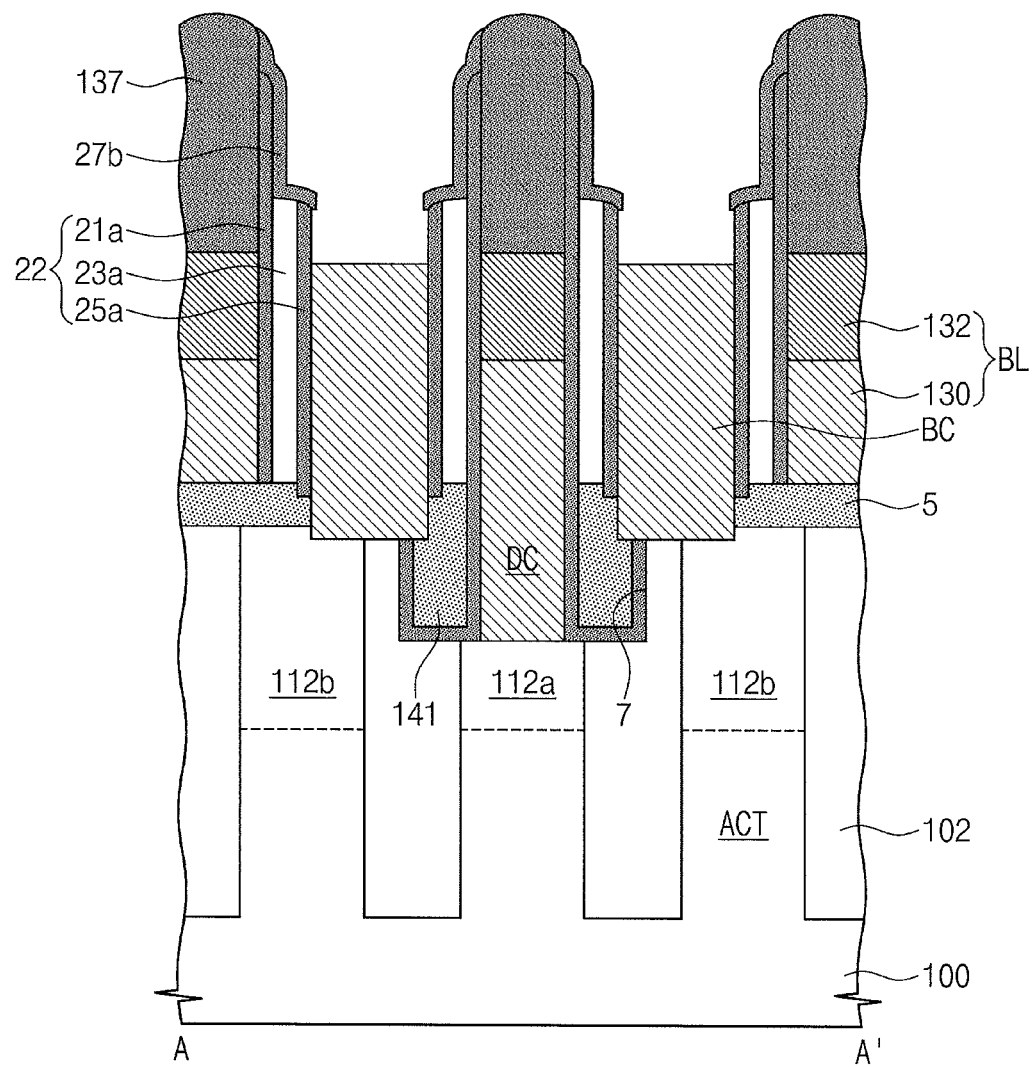

FIGS. 10A through 10C are cross-sectional views sequentially illustrating a procedure of a method of fabricating the semiconductor memory device of FIG. 9.

Referring to FIG. 10A, in a step of FIG. 8C, a second spacer layer 27 and a sacrificial spacer layer 30 may be sequentially conformally stacked on the entire surface of the substrate 100. A sum of thicknesses of the second spacer layer 27 and the sacrificial spacer layer 30 may be the same as or greater than a sum of widths of the second sub-spacer 23a and the third sub-spacer 25a. The sacrificial spacer layer 30 may be formed of a material having an etch selectivity to the second spacer layer 27. For example, the second spacer layer 27 may be formed of a silicon nitride layer, and the sacrificial spacer layer 30 may be formed of a silicon oxide layer.

Referring to FIG. 10B, an anisotropic etching process may be performed on the sacrificial spacer layer 30 and the second spacer layer 27 to form a sacrificial spacer 30a and a second spacer 27b covering a side surface of the bit line capping pattern 137 and to expose a top surface of the storage node contact plug BC.

Referring to FIG. 10C, the sacrificial spacer 30a may be selectively removed to expose a side surface of the second spacer 27b. In this step, an upper portion of the storage node contact plug BC may also be recessed. Alternatively, an additional etching process may be performed on the storage node contact plug BC. Thereafter, subsequent processes will be performed as discussed with reference to FIGS. 1A through 1C.

Figure 11:
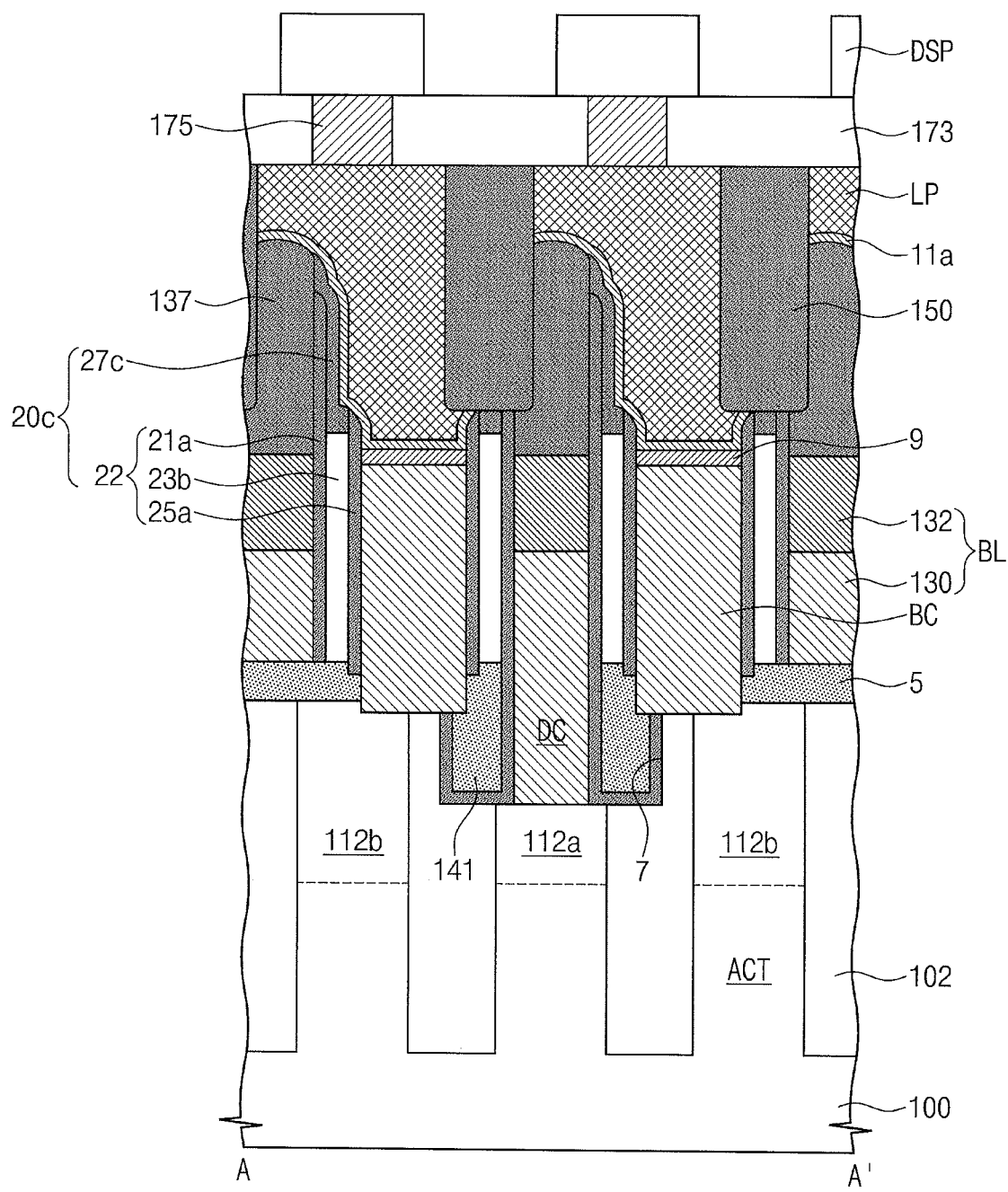
FIG. 11 is a cross-sectional view taken along line A-A' of FIG. 1A according to exemplary embodiments of the present inventive concept.

FIG. 11 is a cross-sectional view taken along line A-A' of FIG. 1A according to exemplary embodiments of the present inventive concept.

Referring to FIG. 11, in a semiconductor memory device according to embodiments of the present inventive concept, a bit line spacer 20c may include a first spacer 22 and a second spacer 27c. The first spacer 22 may include first, second, and third sub-spacers (inner spacer) 21a, 23b, and 25a. The second sub-spacer 23b may have an uppermost surface that is recessed (i.e., a recessed surface) below an adjacent uppermost surface of the third sub-spacer 25a. The second spacer 27c may have a portion that extends interposed between the first and third sub-spacers 21a and 25a. The second spacer 27c may have a lower side wall that is aligned with a side wall of the second sub-spacer 23b. Other configurations may be identical or similar to those discussed with reference to FIG. 9.

FIGS. 9 and 11 show structures in which the second sub-spacer 23a/23b may have a top surface, which is covered with a bottom surface of the second spacer 27b/27c and thus not exposed to outside. After the formation of the data storage part DSP, a hydrogen ($H_2$) passivation process may be performed to enhance GIDL (Gate Induced Drain Leakage) characteristics of a cell. When the second sub-spacer 23a/23b is formed of a silicon oxide layer, and the third sub-spacer 25a and the second spacer 27b/27b are formed of a silicon nitride layer, the third sub-spacer 25a and the second spacer 27b/27c may act as a hydrogen barrier such that hydrogen may be prevented from being trapped in the second sub-spacer 23a/23b. A hydrogen passivation process effect may thus be prevented from being deteriorated. As a result, a cell may be enhanced in its GIDL characteristics.

Figure 12A:
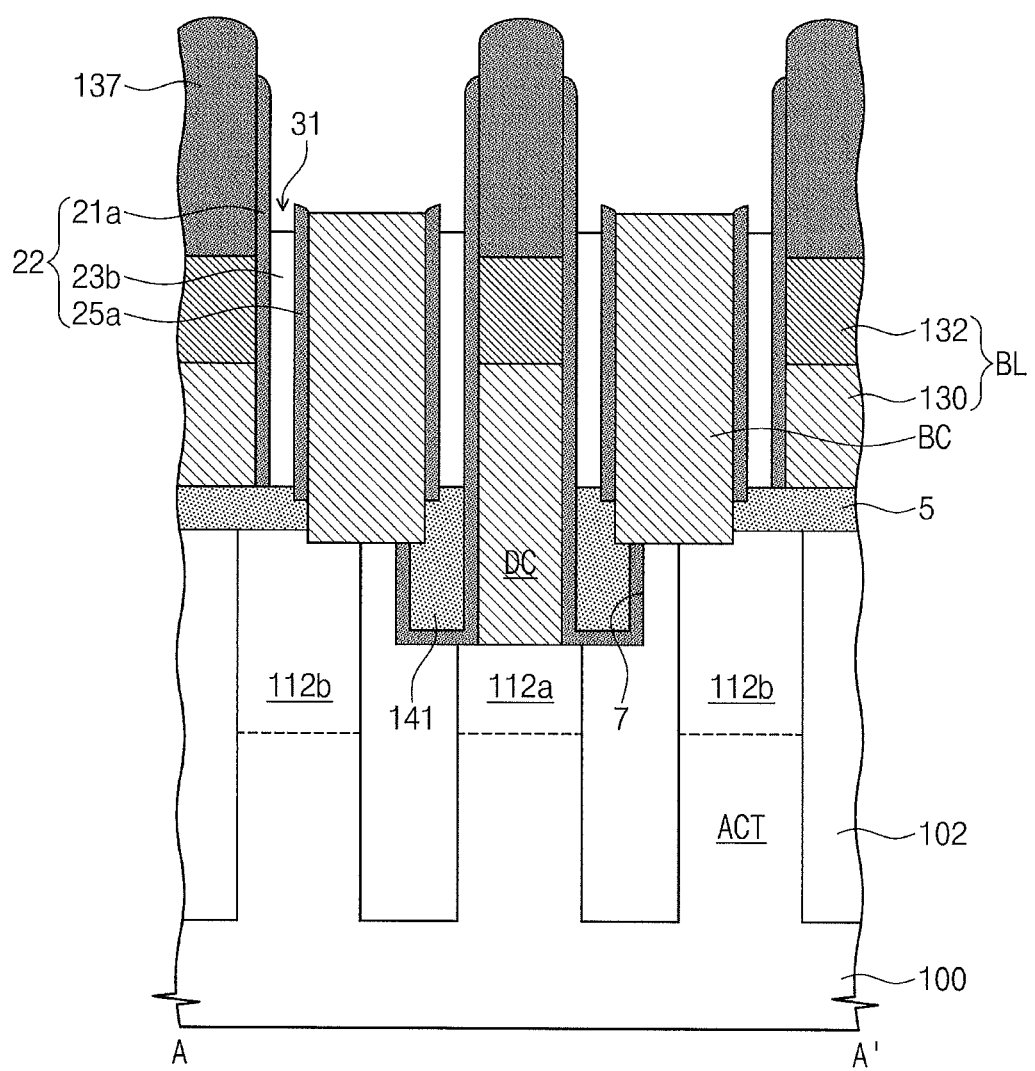
FIGS. 12A through 12C are cross-sectional views illustrating fabricating the semiconductor memory device of FIG. 11.
Figure 12B:
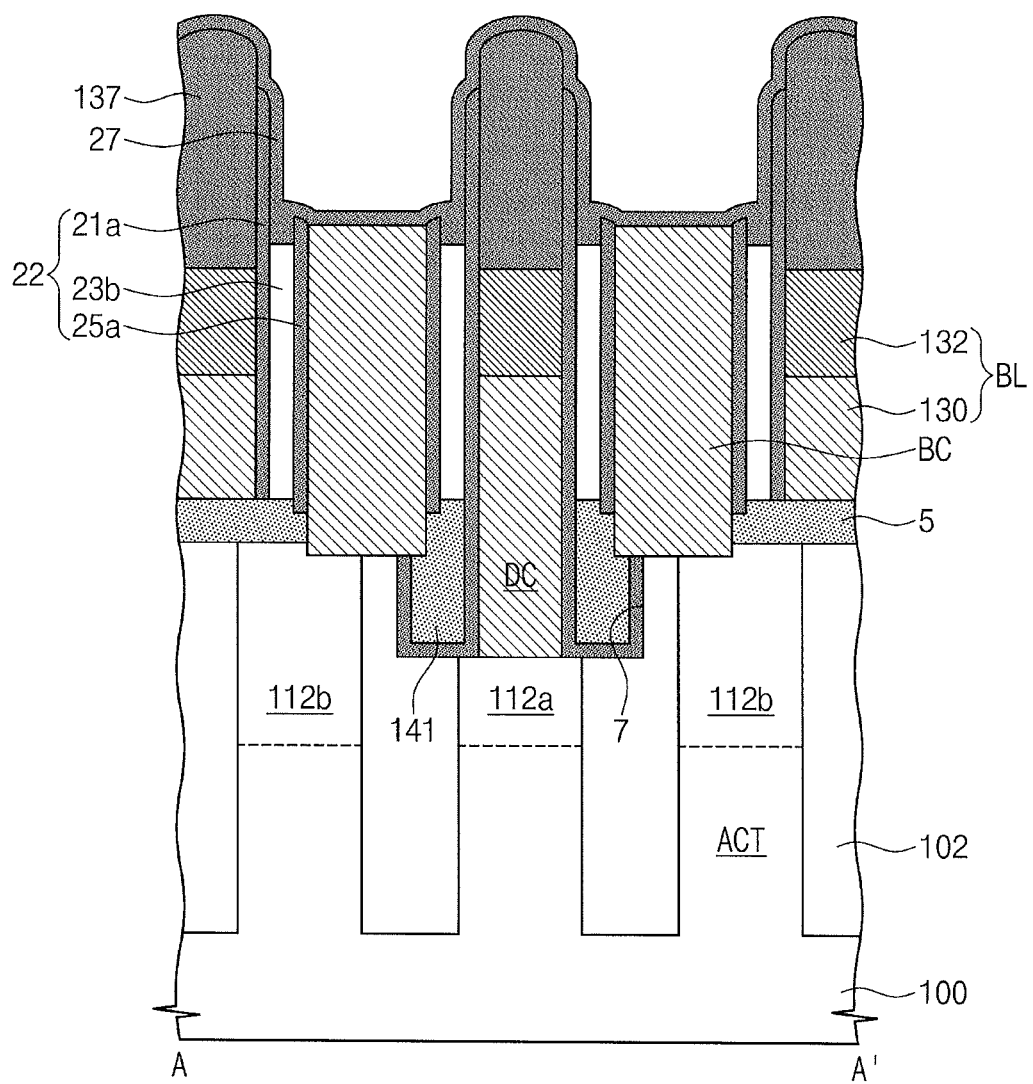
Figure 12C:
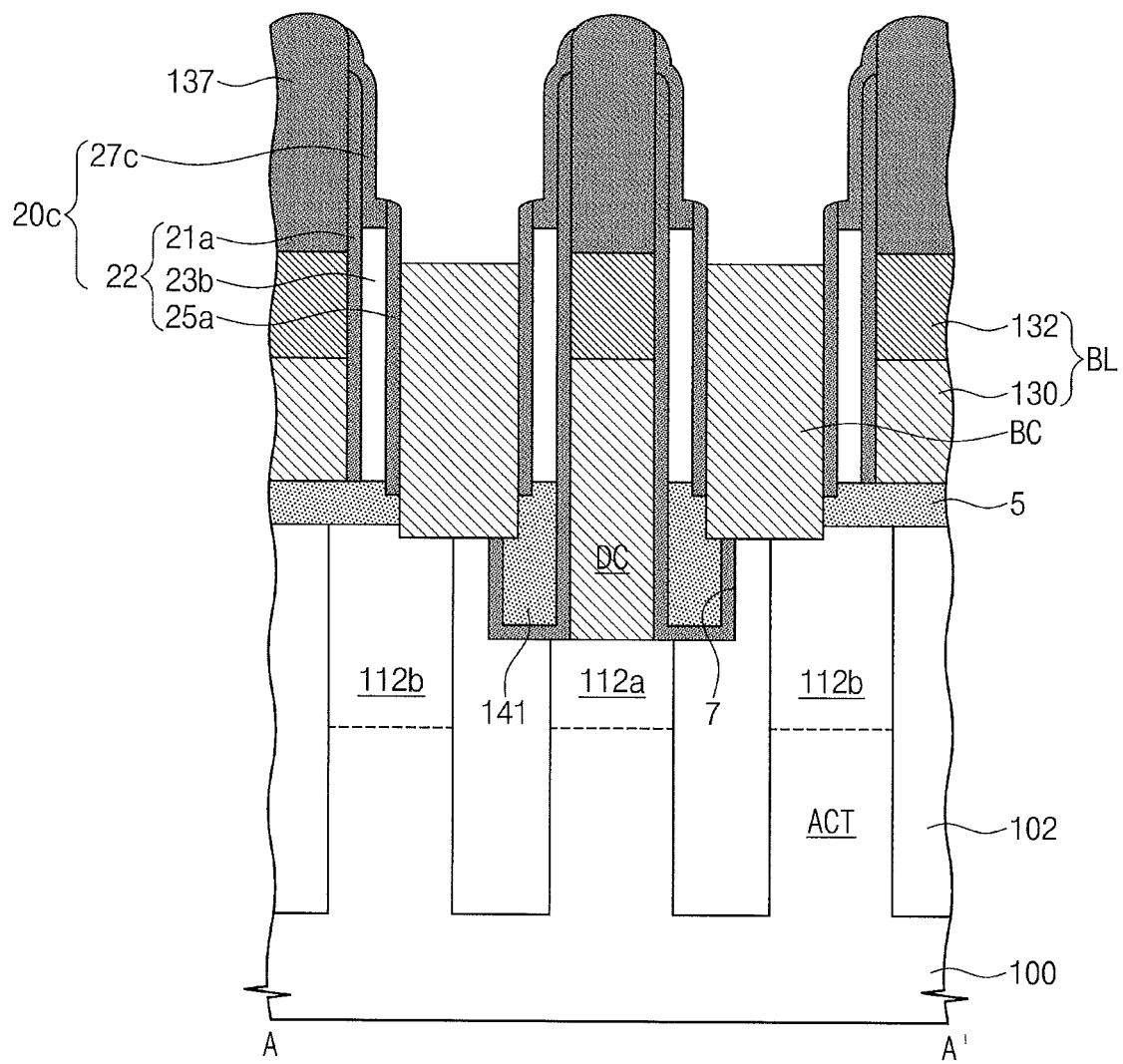

FIGS. 12A through 12C are cross-sectional views sequentially illustrating a procedure of a method of fabricating the semiconductor memory device of FIG. 11.

Referring to FIG. 12A, a removal may be performed on an exposed upper portion of the second sub-spacer 23b in a state illustrated in FIG. 8C. Accordingly, a recessed region 31 may be formed between a side wall of the first sub-spacer 21a and an upper side wall of the third sub-spacer 25a.

Referring to FIG. 12B, the recessed region 31 may be filled with a second spacer layer 27 conformally stacked on the entire surface of the substrate 100. The second spacer layer 27 may be formed to have a thickness less than a sum of widths of the second sub-spacer 23b and the third sub-spacer 25a.

Referring to FIG. 12C, a second spacer (lower spacer layer) 27c may be formed by an anisotropic etching process performed on the second spacer layer 27. The second sub-spacer 23b may not be exposed during the formation of the second spacer 27c. Accordingly, a bit line spacer 20c may be formed to have an outer side wall whose profile is prevented from being undesirably deformed. Consequently, the bit line spacer 20c may stably protect the bit line BL, and good insulation characteristics may be steadily maintained between the bit line BL and the storage node contact plug BC.

An upper portion of the storage node contact plug BC may be partially etched during the anisotropic etching process. Alternatively, an additional etching process may be performed on the storage node contact plug BC. Thereafter, subsequent processes will be performed as discussed with reference to FIGS. 1A through 1C.

Figure 13:
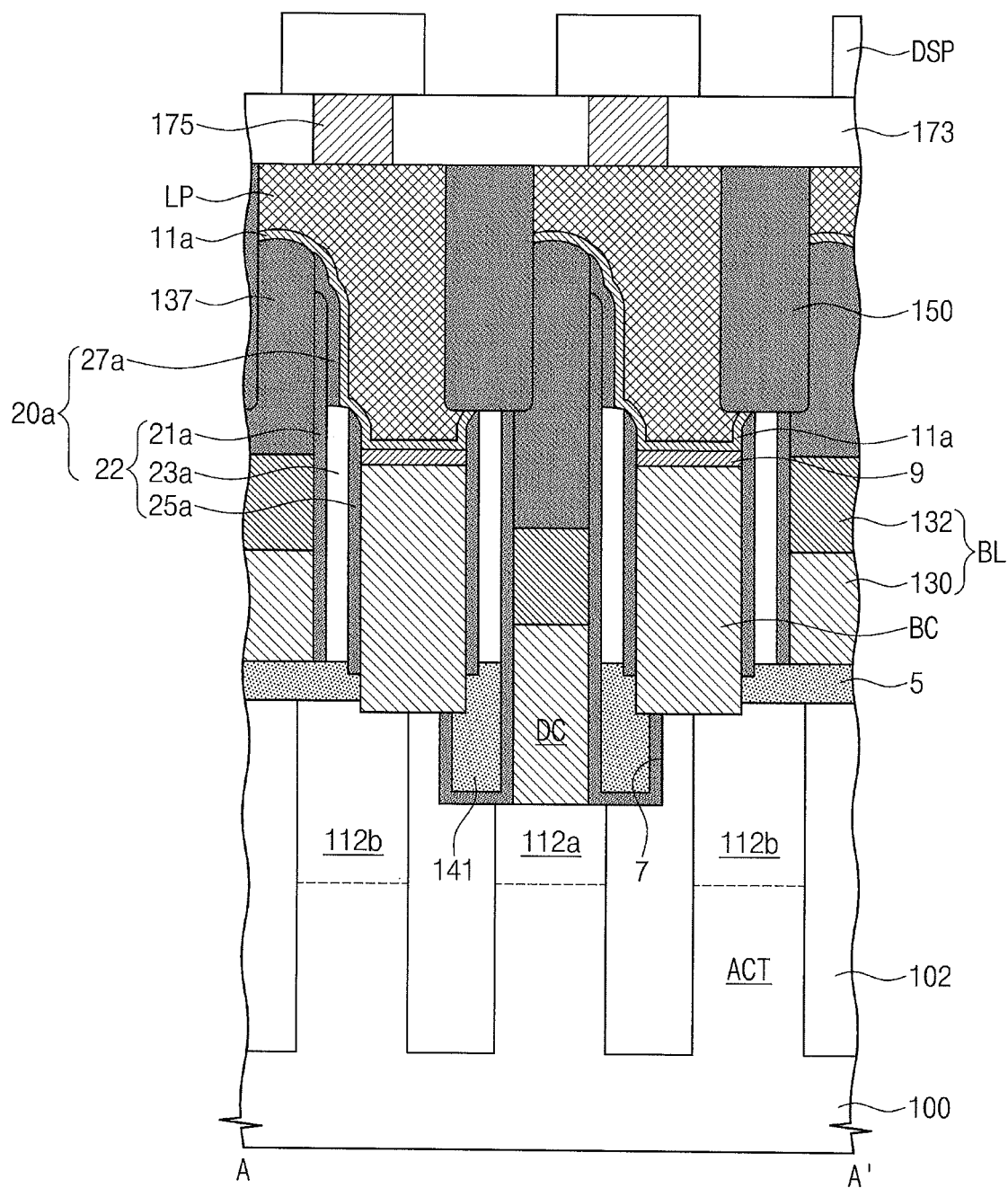
FIG. 13 is a cross-sectional view taken along line A-A' of FIG. 1A according to exemplary embodiments of the present inventive concept.

FIG. 13 is a cross-sectional view taken along line A-A' of FIG. 1A according to exemplary embodiments of the present inventive concept. As shown in FIG. 13, the center bit line structure BL includes a comparatively thicker bit line capping pattern 137 that extends past an uppermost surface of the adjacent storage node contact plug BC toward the substrate 100. Accordingly, in some embodiments, an uppermost surface of a bit line metal-containing pattern 132 in the center bit line structure BL is at a different level than the corresponding uppermost surfaces of the bit line metal-containing patterns 132 included in the outer bit line structures BL. Still further, in some embodiments, the uppermost surface of the storage node contact plug BC is above an uppermost surface of the bit line metal-containing pattern 132 in the center bit line structure BL and is co-planar with an uppermost surface of the bit line metal-containing pattern 132 in the outer bit line structures BL adjacent to the center bit line structure BL.

Figure 14:
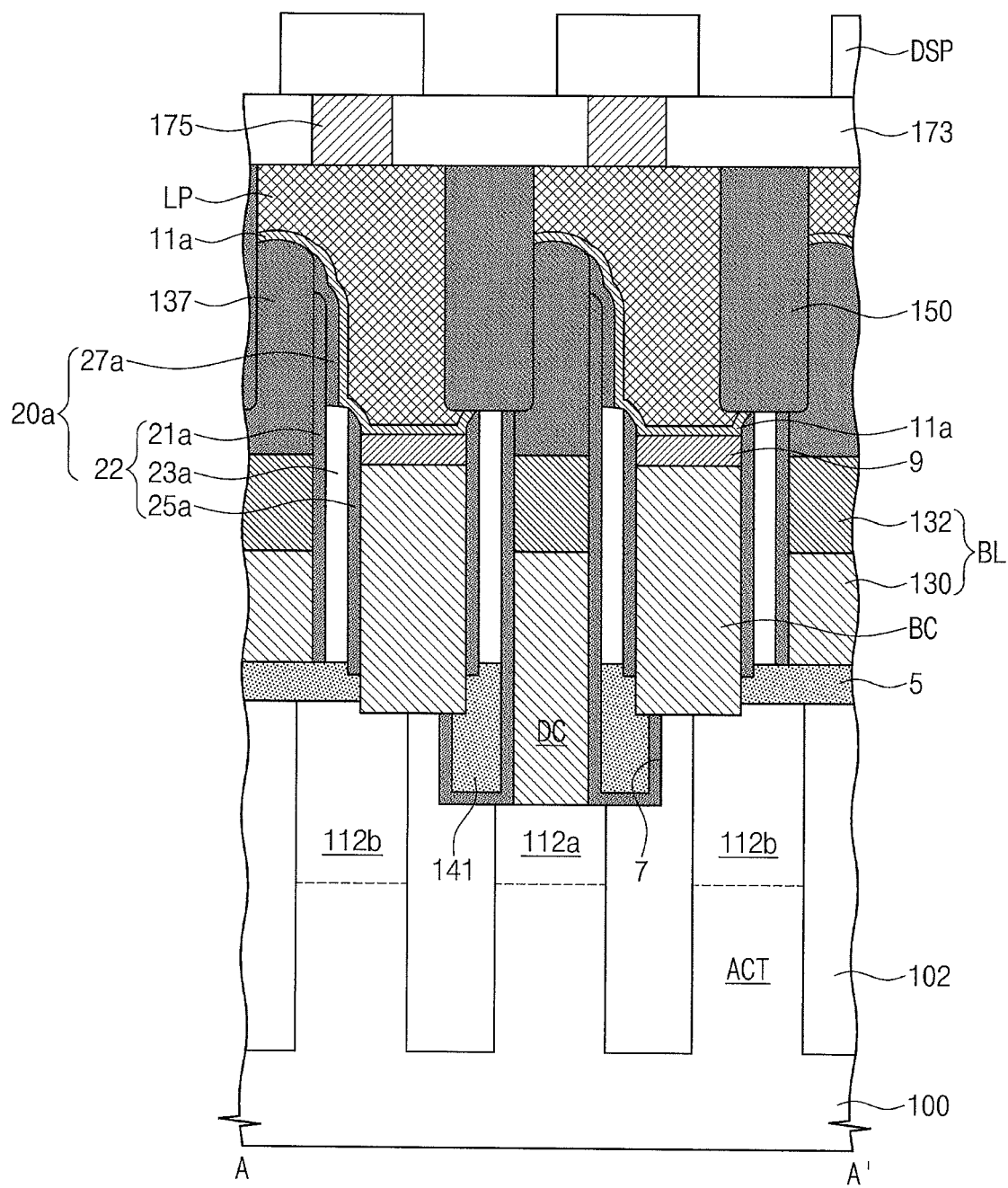
FIG. 14 is a cross-sectional view taken along line A-A' of FIG. 1A according to exemplary embodiments of the present inventive concept.

FIG. 14 is a cross-sectional view taken along line A-A' of FIG. 1A according to exemplary embodiments of the present inventive concept. As shown in FIG. 13, in some embodiments, the ohmic layer 9 on the uppermost surface of the storage node contact plug BC can be formed thicker than the ohmic layer 9 shown in, for example FIG. 7, so that the lowest surface of the landing pad LP is above the uppermost surface of the bit line metal-containing pattern 132 in the bit line structure BL.

According to embodiments of the present inventive concept, a semiconductor memory device may have a good connection between the landing pad and the storage node contact. In addition, a hydrogen passivation process effect may be prevented from being deteriorated. Furthermore, the bit line may be stably protected, and good insulation characteristics may be steadily maintained between the bit line and the storage node contact.

What is claimed:

1. A method of forming a volatile memory device, the method comprising:
   forming a bit line structure having a vertical sidewall protruding from a substrate;
   forming a lower spacer layer on the vertical sidewall to have a first thickness;
   removing the lower spacer layer from the substrate adjacent to the bit line structure to form a lower spacer having the first thickness from the vertical sidewall to an outer sidewall of the lower spacer;
   forming a storage node contact plug on the substrate aligned to the lower spacer to cover the outer sidewall of the lower spacer and to expose an upper portion of the lower spacer;
   removing the upper portion of the lower spacer using the storage node contact plug as a mask; and
   forming an upper spacer on the vertical sidewall to expose an uppermost portion of the outer sidewall of the lower spacer, the upper spacer formed to have a second thickness that is less than the first thickness,
   wherein the upper spacer extends in a vertical direction, and a bottom-most surface of the upper spacer is offset above an uppermost surface of the storage node contact plug, such that the bottom-most surface of the upper spacer does not abut the uppermost surface of the storage node contact plug.

2. The method of claim 1, wherein the forming the upper spacer further comprises removing the upper spacer from the storage node contact plug and the outer sidewall of the lower spacer to expose an uppermost portion of the lower spacer.

3. The method of claim 2, wherein the lower spacer layer comprises a first sub-spacer on the vertical sidewall and a second sub-spacer on the first sub-spacer, and
   wherein removing the upper portion of the lower spacer comprises removing the upper portion of the lower spacer using the storage node contact plug as the mask to expose at least a portion of the uppermost portion of the lower spacer including the first sub-spacer and the second sub-spacer and to cover a remaining portion of the uppermost portion of the lower spacer.

4. The method of claim 1,
   wherein the lower spacer layer comprises a first sub-spacer on the vertical sidewall and a second sub-spacer on the first sub-spacer, and
   wherein the forming the upper spacer further comprises removing the upper spacer from the storage node contact plug and the outer sidewall of the lower spacer to completely cover an uppermost surface of the lower spacer.

5. The method of claim 1, wherein the lower spacer layer comprises a first sub-spacer on the vertical sidewall and a second sub-spacer on the first sub-spacer,
   wherein the removing the upper portion of the lower spacer comprises recessing an uppermost surface of the first sub-spacer relative to the second sub-spacer to form a recess in the first sub-spacer between the vertical sidewall and the outer sidewall of the lower spacer, and
   wherein the forming the upper spacer comprises forming the upper spacer on the vertical sidewall above the lower spacer to fill the recess.

6. The method of claim 1, wherein the lower spacer is formed separately from the upper spacer.

7. The method of claim 1, wherein the bottom-most surface of the upper spacer is above an uppermost surface of the lower spacer.

8. The method of claim 1, wherein the lower spacer is not an air gap.

9. A method of forming a semiconductor memory device, the method comprising:
 forming a bit line structure on a substrate;
 forming a lower spacer covering a lower sidewall of the bit line structure, the lower spacer having a first thickness;
 forming a storage node contact plug on the substrate at a side of the lower spacer, the storage node contact plug exposing an upper portion of the lower spacer;
 removing the upper portion of the lower spacer using the storage node contact plug as a mask; and
 forming an upper spacer on an upper sidewall of the bit line structure, the upper spacer having a second thickness that is less than the first thickness,
 wherein the lower spacer comprises a first sub-spacer covering a vertical sidewall of the bit line structure and a second sub-spacer on the first sub-spacer, and
 wherein the upper spacer extends in a vertical direction, and a bottom-most surface of the upper spacer is offset above an uppermost surface of the storage node contact plug, such that the bottom-most surface of the upper spacer does not abut the uppermost surface of the storage node contact plug.

10. The method of claim 9, wherein the upper spacer is in direct contact with the first sub-spacer and spaced apart from the second sub-spacer.

11. The method of claim 9, wherein the forming the upper spacer comprises:
 conformally forming an upper spacer layer on an entire surface of the substrate;
 forming a sacrificial spacer layer on the upper spacer layer; and
 anisotropically etching the sacrificial spacer layer and the upper spacer layer to form a sacrificial spacer and the upper spacer and to expose an upper surface of the storage node contact plug.

12. The method of claim 11, wherein the sacrificial spacer layer is formed of a material having an etch selectivity to the upper spacer layer.

13. The method of claim 11, further comprising:
 removing the sacrificial spacer to expose the upper spacer,
 wherein the upper spacer covers both the first sub-spacer and the second sub-spacer.

14. The method of claim 13, wherein the upper spacer has a first portion covering the upper sidewall of the bit line structure and a second portion protruding from a lower sidewall of the first portion to cover the first sub-spacer and the second sub-spacer.

15. The method of claim 9, further comprising, before the forming the upper spacer:
 removing an upper portion of the first sub-spacer to form a recess on the first sub-spacer,
 wherein the upper spacer fills the recess.

16. A method of forming a semiconductor memory device, the method comprising:
 forming a bit line structure on a substrate;
 forming a lower spacer covering a lower sidewall of the bit line structure, the lower spacer having a first thickness;
 forming a storage node contact plug on the substrate at a side of the lower spacer, the storage node contact plug exposing an upper portion of the lower spacer;
 removing the upper portion of the lower spacer using the storage node contact plug as a mask; and
 forming an upper spacer on an upper sidewall of the bit line structure, the upper spacer having a second thickness that is less than the first thickness,
 wherein the lower spacer comprises a first sub-spacer, a second sub-spacer and a third sub-spacer sequentially covering a vertical sidewall of the bit line structure, and
 wherein the upper spacer extends in a vertical direction, and a bottom-most surface of the upper spacer is offset above an uppermost surface of the storage node contact plug, such that the bottom-most surface of the upper spacer does not abut the uppermost surface of the storage node contact plug.

17. The method of claim 16, further comprising, before the forming the bit line structure:
 forming a recess by removing a portion of the substrate; and
 forming a polysilicon pattern to fill the recess,
 wherein the forming the bit line structure comprises etching the polysilicon pattern to form a bit line contact plug in the recess and to expose an inner sidewall of the recess, and
 wherein the first sub-spacer covers the inner sidewall of the recess.

18. The method of claim 16, wherein the first sub-spacer covers the upper sidewall of the bit line structure and the upper spacer covers a sidewall of the first sub-spacer and an upper surface of the second sub-spacer.

19. The method of claim 16, wherein the forming the upper spacer comprises:
 conformally forming an upper spacer layer on an entire surface of the substrate;
 forming a sacrificial spacer layer on the upper spacer layer; and
 anisotropically etching the sacrificial spacer layer and the upper spacer layer to form a sacrificial spacer and the upper spacer and to expose an upper surface of the storage node contact plug.

20. The method of claim 19, further comprising:
 removing the sacrificial spacer to expose the upper spacer,
 wherein the upper spacer covers both the second sub-spacer and the third sub-spacer.

21. The method of claim 20, wherein the upper spacer has a first portion covering the upper sidewall of the bit line structure and a second portion protruding from a lower sidewall of the first portion to cover the second sub-spacer and the third sub-spacer.

22. The method of claim 19, further comprising, before the forming the upper spacer:
 removing an upper portion of the second sub-spacer to form a recess on the second sub-spacer,
 wherein the upper spacer fills the recess.

* * * * *